United States Patent
Mizuta et al.

(10) Patent No.: US 10,741,380 B2
(45) Date of Patent: Aug. 11, 2020

(54) METHOD FOR WASHING SEMICONDUCTOR MANUFACTURING APPARATUS COMPONENT, APPARATUS FOR WASHING SEMICONDUCTOR MANUFACTURING APPARATUS COMPONENT, AND VAPOR PHASE GROWTH APPARATUS

(71) Applicant: FURUKAWA CO., LTD., Tokyo (JP)

(72) Inventors: Masashi Mizuta, Tochigi (JP); Yuichi Yaguchi, Tochigi (JP); Yutaka Nishikori, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 0 days.

(21) Appl. No.: 16/223,689

(22) Filed: Dec. 18, 2018

(65) Prior Publication Data

US 2019/0122880 A1 Apr. 25, 2019

Related U.S. Application Data

(62) Division of application No. 14/116,037, filed as application No. PCT/JP2012/001829 on Mar. 15, 2012, now abandoned.

(30) Foreign Application Priority Data

May 19, 2011 (JP) .................. 2011-112426
Jul. 25, 2011 (JP) .................. 2011-162261

(51) Int. Cl.
 *H01L 21/02* (2006.01)
 *C23C 16/44* (2006.01)
 *H01L 21/67* (2006.01)

(52) U.S. Cl.
 CPC .... *H01L 21/02041* (2013.01); *C23C 16/4405* (2013.01); *H01L 21/67028* (2013.01)

(58) Field of Classification Search
 None
 See application file for complete search history.

(56) References Cited

U.S. PATENT DOCUMENTS

| 4,551,197 A | 11/1985 | Guilmette et al. |
| 6,203,618 B1 | 3/2001 | Hashizume et al. |

(Continued)

FOREIGN PATENT DOCUMENTS

| AU | 606153 | 1/1991 |
| CN | 1622350 | 6/2005 |

(Continued)

OTHER PUBLICATIONS

International Search Report dated Jun. 19, 2012 filed in PCT/JP2012/001829.

(Continued)

*Primary Examiner* — Eric W Golightly
(74) *Attorney, Agent, or Firm* — Rankin, Hill & Clark LLP

(57) ABSTRACT

A method for washing a semiconductor manufacturing apparatus component, the method comprising: a first process of disposing a semiconductor manufacturing apparatus component, to which a nitride semiconductor adheres, in a component holding portion inside a reaction tank of a washing apparatus; a second process of introducing a halogen-containing gas from a gas introducing pipe into the reaction tank to remove the nitride semiconductor adhered to the semiconductor manufacturing apparatus component; a third process of trapping a reaction product generated by a reaction of the halogen-containing gas and the nitride semiconductor in a trapping unit; and a fourth process of discharging the reaction product trapped by the trapping unit from a gas discharging pipe to outside of the reaction tank.

19 Claims, 10 Drawing Sheets

(56) References Cited

U.S. PATENT DOCUMENTS

| | | |
|---|---|---|
| 6,212,789 B1 | 4/2001 | Kato et al. |
| 6,223,684 B1 | 5/2001 | Fujioka et al. |
| 6,238,514 B1 | 5/2001 | Gu |
| 2002/0069825 A1 | 6/2002 | Saito |
| 2002/0185068 A1 | 12/2002 | Gurary et al. |
| 2003/0213562 A1 | 11/2003 | Gondhalekar et al. |
| 2003/0216041 A1 | 11/2003 | Herring et al. |
| 2004/0081607 A1 | 4/2004 | Hasegawa |
| 2004/0231711 A1 | 11/2004 | Park et al. |
| 2005/0047927 A1 | 3/2005 | Lee et al. |
| 2005/0110029 A1 | 5/2005 | Aoyagi et al. |
| 2006/0180026 A1 | 8/2006 | Gu |
| 2006/0275937 A1 | 12/2006 | Aoyagi et al. |
| 2009/0050057 A1 | 2/2009 | Von Der Waydbrink et al. |
| 2009/0130860 A1 | 5/2009 | Miya et al. |
| 2010/0224591 A1 | 9/2010 | Kondo |
| 2010/0273290 A1 | 10/2010 | Kryliouk |
| 2011/0052833 A1 | 3/2011 | Chung |
| 2011/0079251 A1 | 4/2011 | Kryliouk |

FOREIGN PATENT DOCUMENTS

| | | |
|---|---|---|
| CN | 2808933 Y | 8/2006 |
| JP | 64-65023 | 3/1989 |
| JP | 2005-524529 | 8/2005 |
| JP | 2006-332201 | 7/2006 |
| JP | 2007-109928 | 4/2007 |
| JP | 2009-124050 | 6/2009 |
| JP | 2009-188198 | 8/2009 |
| JP | 2010-016200 | 1/2010 |
| JP | 2010-510167 | 4/2010 |
| JP | 2010-212400 | 9/2010 |
| JP | 2010-245376 | 10/2010 |
| TW | 201104743 | 2/2011 |
| WO | 03/095239 | 11/2003 |
| WO | 2007/004808 | 1/2007 |
| WO | 2008/064109 | 5/2008 |
| WO | 2010/129183 | 11/2010 |

OTHER PUBLICATIONS

Taiwanese Office Action dated Oct. 22, 2014 issued in Taiwanese patent application No. 101109737.
Japanese Office Action dated Nov. 11, 2014 issued in Japanese patent application No. 2013-514961.
Extended European Search Report dated Feb. 9, 2015 issued in European patent application No. 12784871.1.
Chinese Office Action dated Jun. 23, 2015 issued in Chinese patent application No. 201280024377.X.
Japanese Office Action dated Nov. 4, 2015 issued in Japanese patent application No. 2015-000470.

[FIG.1]
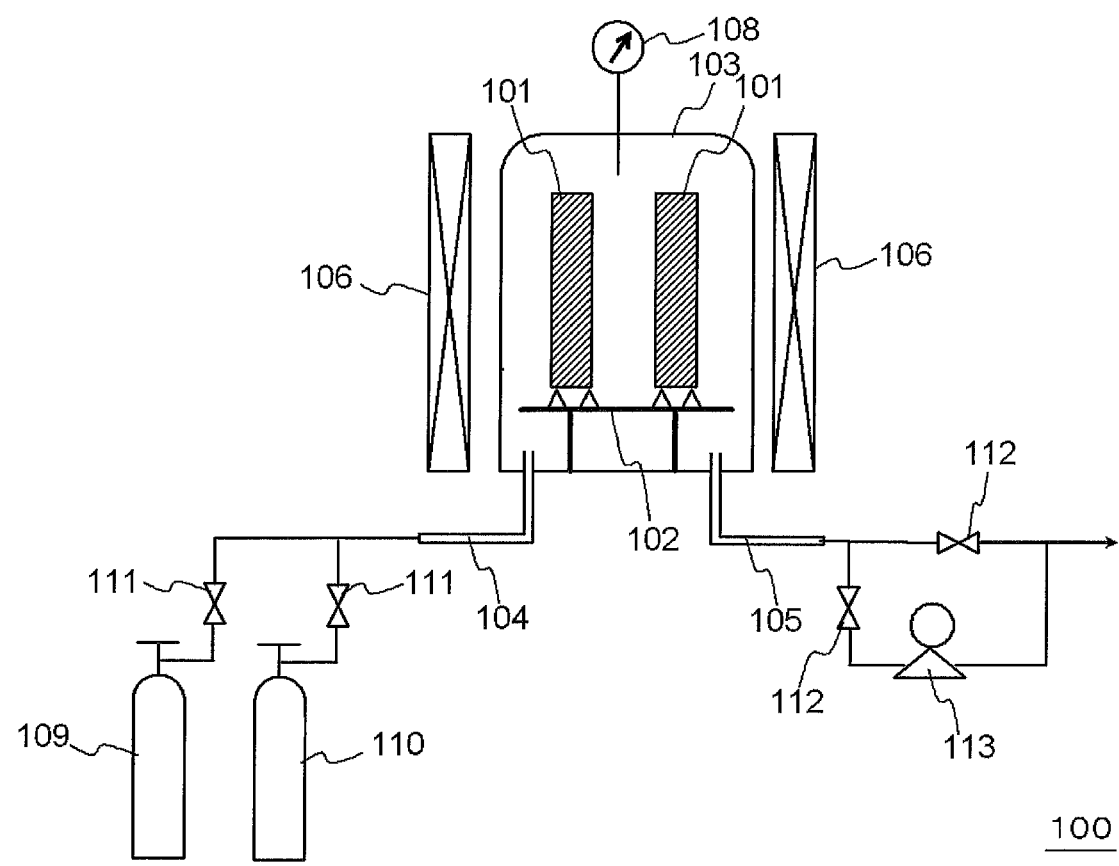

[FIG.2]
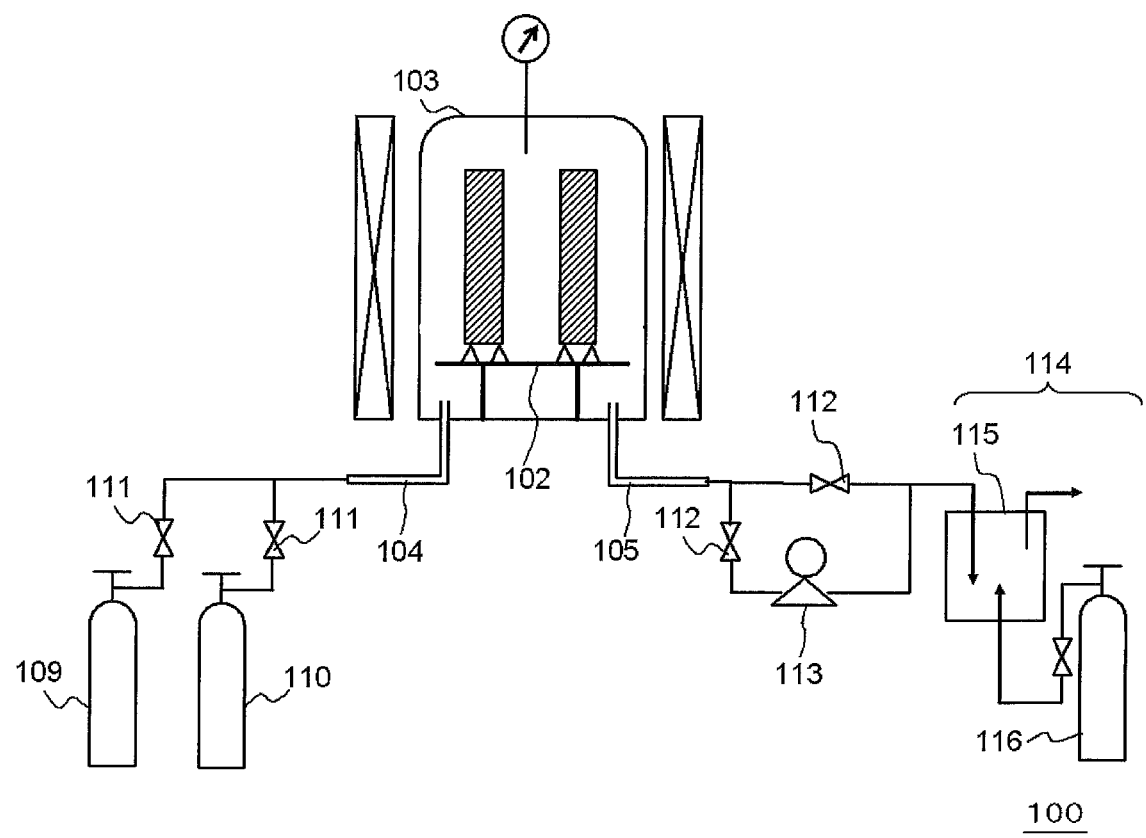

[FIG.3]
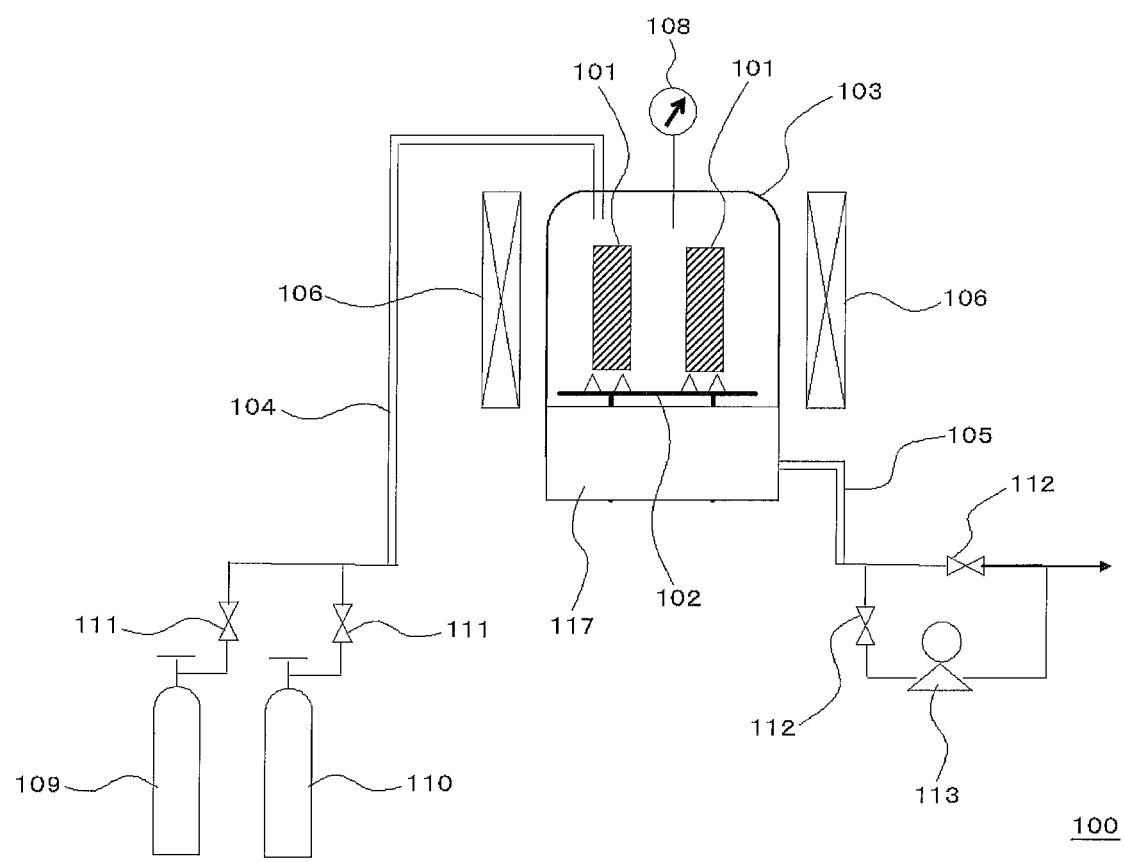

[FIG.4]
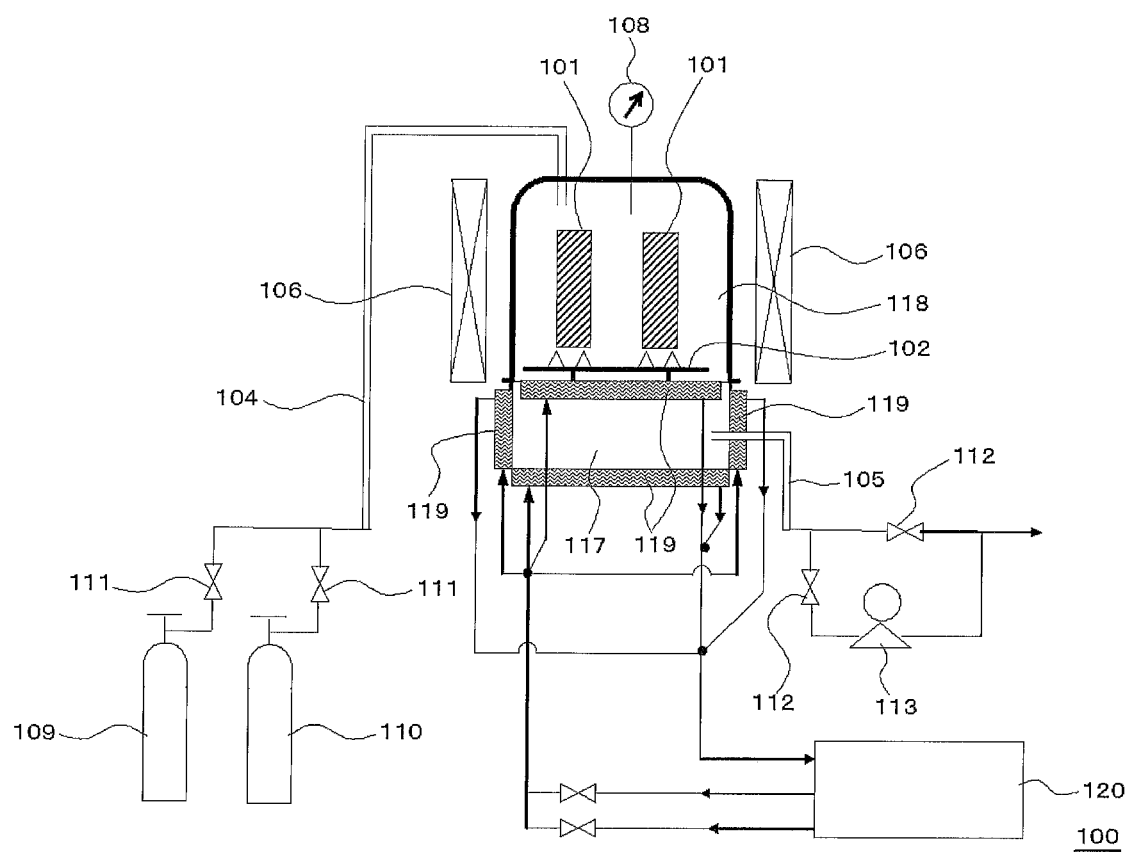

[FIG.5]
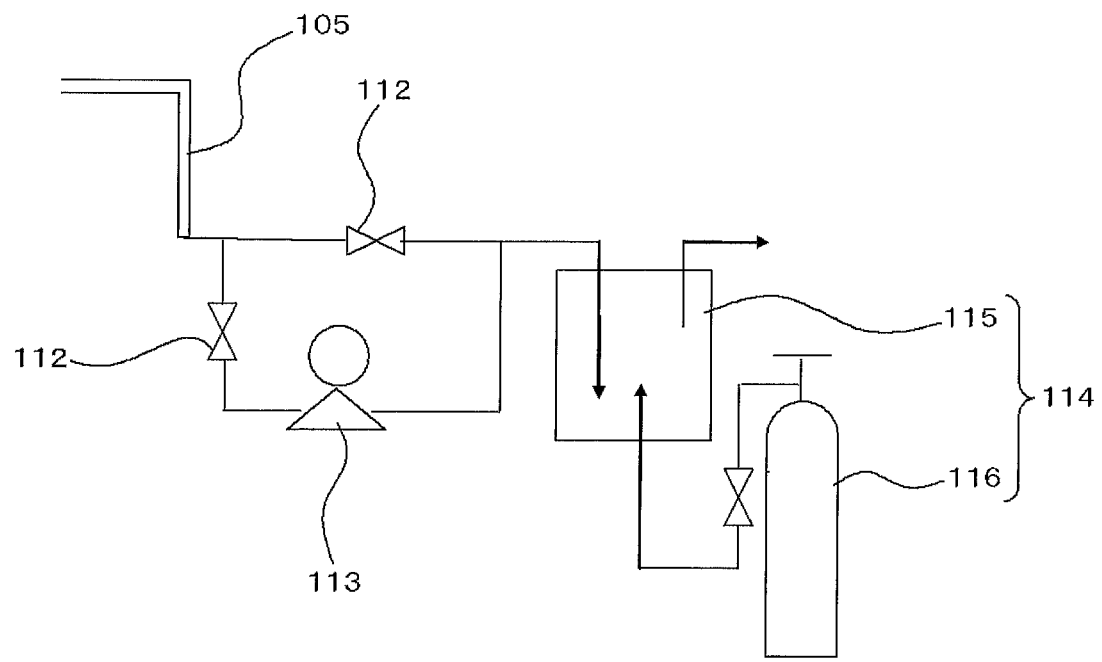

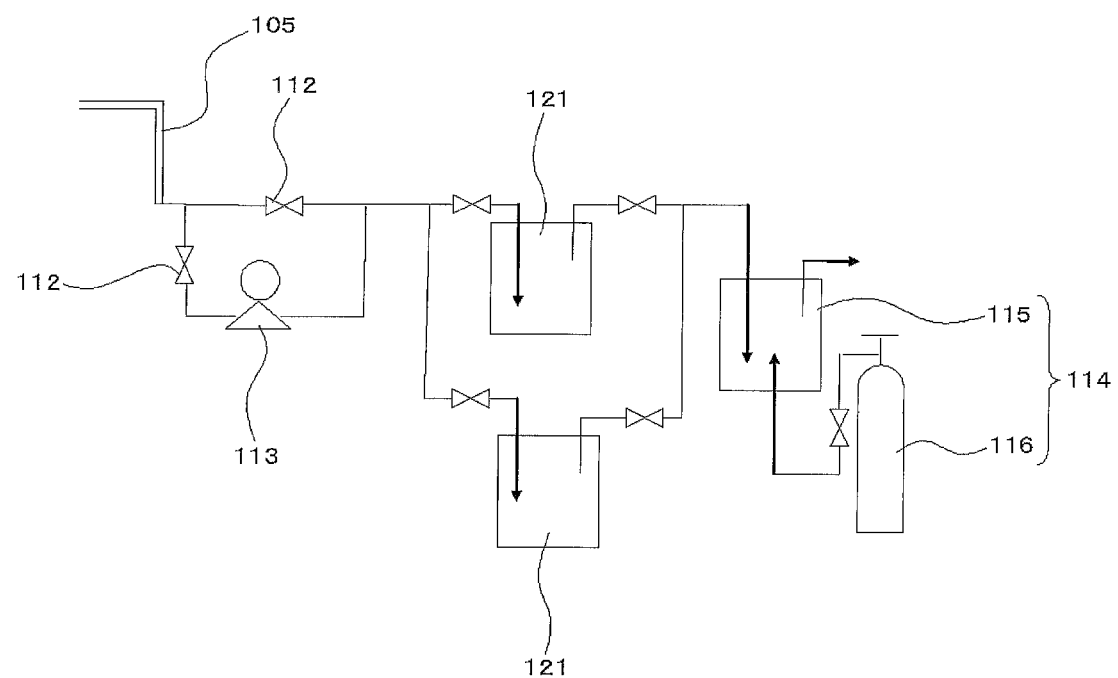
[FIG.6]

[FIG.7]
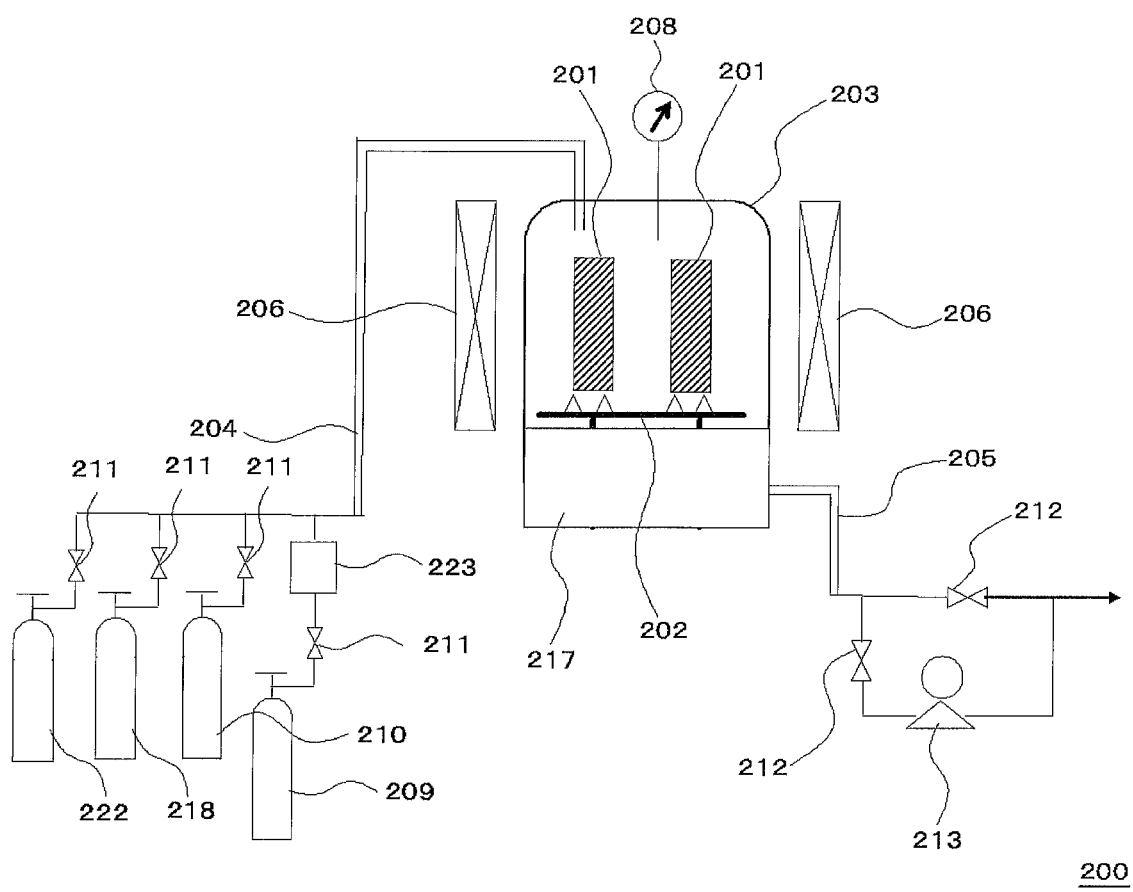

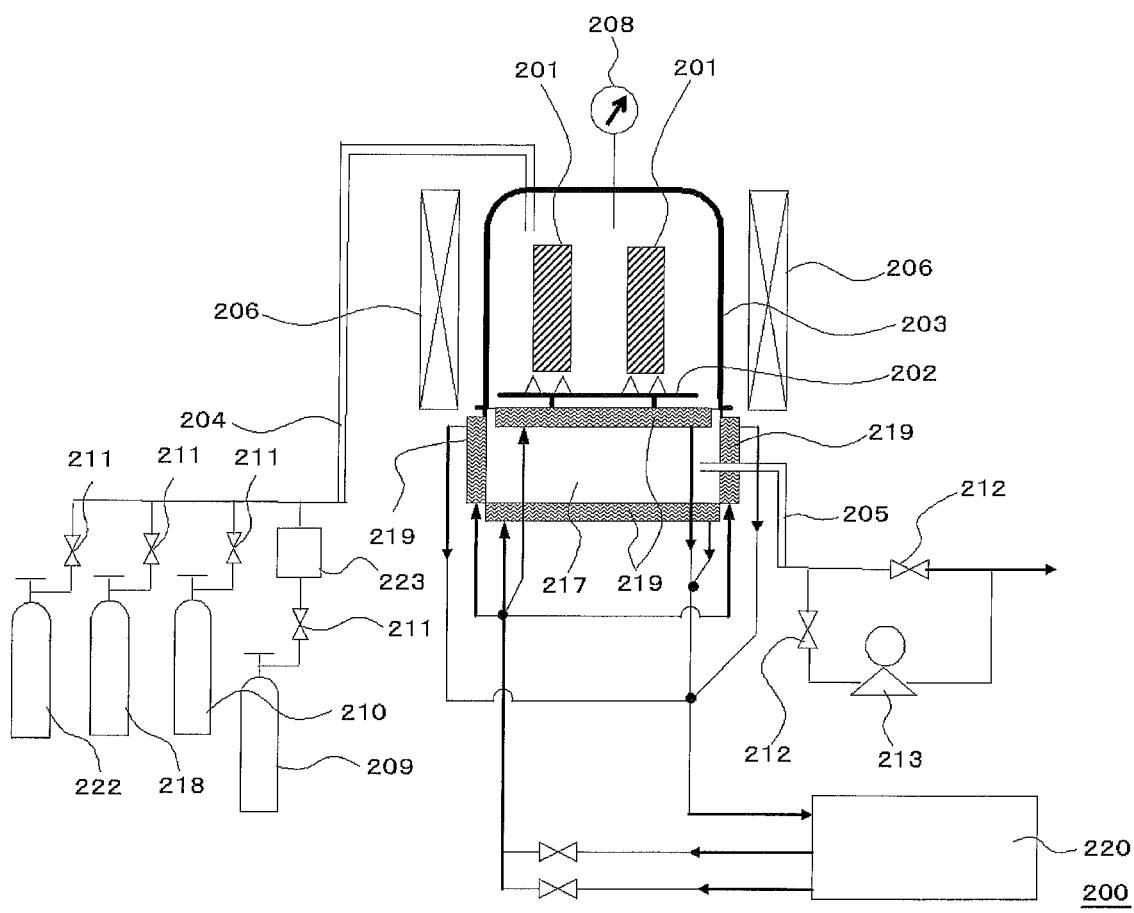
[FIG.8]

[FIG.9]
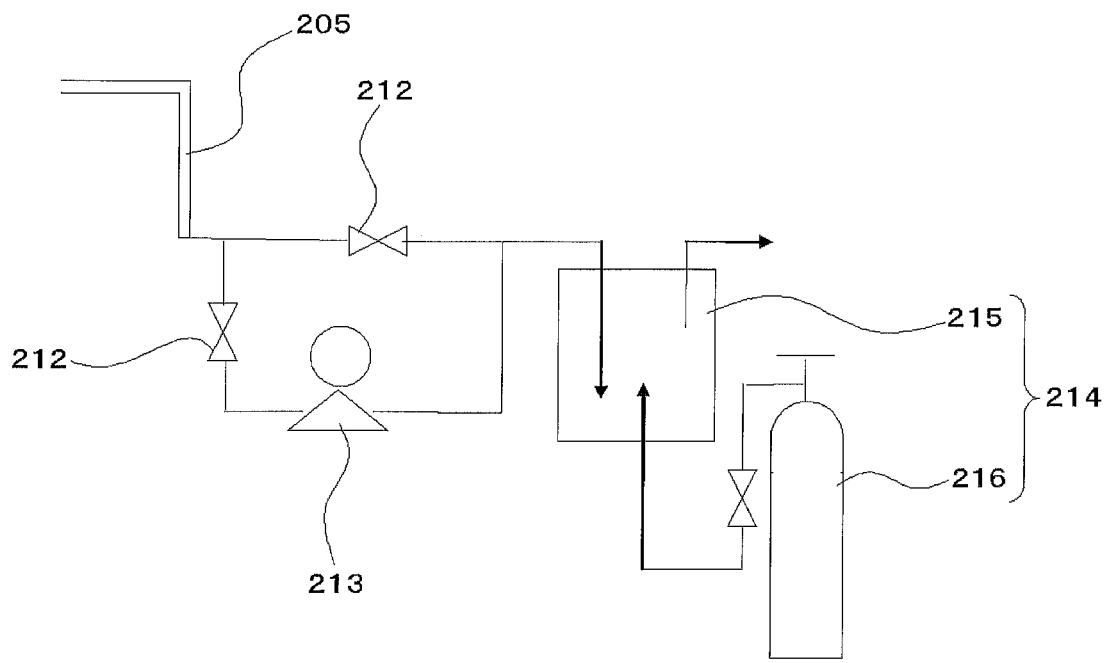

[FIG.10]
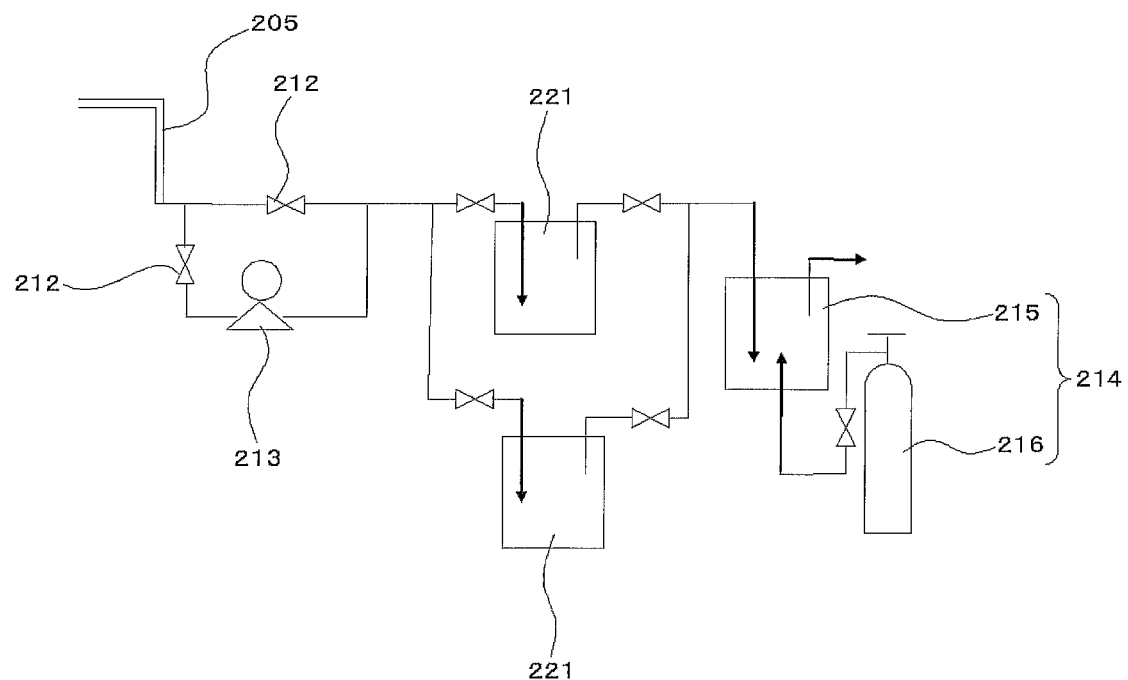

METHOD FOR WASHING SEMICONDUCTOR MANUFACTURING APPARATUS COMPONENT, APPARATUS FOR WASHING SEMICONDUCTOR MANUFACTURING APPARATUS COMPONENT, AND VAPOR PHASE GROWTH APPARATUS

CROSS-REFERENCE TO RELATED APPLICATIONS

This application is a divisional application of Ser. No. 14/116,037, filed Nov. 6, 2013, which is a National Phase Application of International Application No. PCT/JP2012/001829, filed Mar. 15, 2012, which claims the priority of Japan Patent Application No. 2011-112426, filed May 19, 2011 and Japan Patent Application No. 2011-162261, filed Jul. 25, 2011. The present application claims priority from both applications.

TECHNICAL FIELD

The present invention relates to a method for washing a semiconductor manufacturing apparatus component, an apparatus for washing a semiconductor manufacturing apparatus component, and a vapor phase growth apparatus.

BACKGROUND ART

In a nitride semiconductor manufacturing apparatus (hereinafter, referred to as "semiconductor manufacturing apparatus), a semiconductor is manufactured by depositing nitrides such as GaN (gallium nitride) and AlGaN (aluminum gallium nitride) on a silicon wafer. During this process, a semiconductor thin film such as GaN to be deposited on the wafer inside a semiconductor manufacturing apparatus is apt to adhere to various kinds of components such as a wafer tray that holds the wafer, and a gas flow channel other than the wafer.

GaN adhered to the components other than the wafer becomes an unnecessary contaminant, and causes a problem in the manufacturing of the nitride semiconductor. Therefore, it is necessary for a contaminated component to be washed to remove the nitride.

In general, nitrides such as GaN and AlGaN are allowed to react with a washing gas containing a chlorine-based gas as a main component, thereby removing the nitrides adhered to the semiconductor manufacturing apparatus component.

Patent Document 1 (Japanese Unexamined Patent Publication No. 2006-332201) discloses a washing method in which a contaminated component inside a nitride semiconductor manufacturing apparatus is brought into contact with a washing gas containing a chlorine-based gas as a main component at a temperature equal to or higher than 500° C. and equal to or lower than 1000° C. In this Patent Document, the nitride of the contaminated component reacts with the chlorine-based gas in the washing gas. It is considered that a reaction product that is generated vaporizes at a temperature equal to or higher than 500° C. and is removed. In addition, in this method, it is not necessary to set a temperature to a high temperature equal to or higher than 1000° C., and thus it is considered that thermal deformation of a wafer tray does not occur.

In addition, Patent Document 2 (Japanese Unexamined Patent Publication No. 2010-245376) discloses a washing apparatus in which a washing gas introducing pipe is disposed at the bottom of a reaction chamber. Since the washing gas introducing pipe is disposed at the bottom of the reaction chamber, a washing gas that is introduced into the reaction chamber does not collide with a heat insulation member and is not split. Accordingly, it is considered that the washing gas may be used efficiently for washing of the contaminated component.

In addition, Patent Document 3 (Japanese Unexamined Patent Publication No. 2010-212400) discloses an apparatus for washing a nitride semiconductor apparatus component. The apparatus includes a deposition prevention plate provided on a sealing surface side of a sealing cap, which blocks both end openings of a reaction tube having a washing gas introducing pipe and an exhaust gas discharging pipe, to be adjacent to the sealing surface with a space therebetween. Adhesion of a reaction product to an inner wall of the sealing cap may be suppressed due to the deposition prevention plate. Accordingly, when taking out a washed component by opening the reaction tube after washing, generation of a toxic gas due to reaction of the reaction product and moisture in the air does not occur. Accordingly, it is considered that a worker may safely conduct a washing operation.

RELATED DOCUMENT

Patent Document

[Patent Document 1] Japanese Unexamined Patent Publication No. 2006-332201
[Patent Document 2] Japanese Unexamined Patent Publication No. 2010-245376
[Patent Document 3] Japanese Unexamined Patent Publication No. 2010-212400
[Patent Document 4] Japanese Unexamined Patent Publication No. 2007-109928

DISCLOSURE OF THE INVENTION

However, in the methods of Patent Document 1 to Patent Document 3, a reaction product between nitrides such as GaN and AlGaN and a chlorine-based gas may adhere to the semiconductor manufacturing apparatus component or the inside of the washing apparatus in some cases, and thus it is necessary to continuously carry out removal of the reaction product during a washing operation. At this time, a part of an unused washing gas is removed together with the reaction product, and thus it is necessary to continuously supply the washing gas into the apparatus. Therefore, a used amount of the washing gas which is necessary for removal of the contaminant increases.

On the other hand, Patent Document 4 (Japanese Unexamined Patent Publication No. 2007-109928) discloses a method for washing a nitride semiconductor manufacturing apparatus component. In the method, a contaminated component inside a nitride semiconductor manufacturing apparatus is brought into contact with a first washing gas containing a chlorine-based gas as a main component to remove a contaminant, and the contaminated component is brought into contact with a second washing gas to remove a chlorine-based material that remains in the component. In addition, Patent Document 4 discloses that contact with the first washing gas and contact with the second washing gas are carried out in a batch processing (sealing) type.

The document discloses that the sealing type may reduce a used amount of the chlorine gas compared to a ventilation treatment (air stream) type.

The present inventors have tried to wash the semiconductor manufacturing apparatus component with the sealing type according to the method described in Patent Document 4. In the attempt, the used amount of the chlorine gas may be reduced to a certain degree compared to the air stream type. However, the present inventors confirm that washing efficiency is still low, and there is a room for additional improvement.

The invention has been made in consideration of the above-described circumstances, and an object thereof is to provide a method for washing a semiconductor manufacturing apparatus component and an apparatus for washing a semiconductor manufacturing apparatus component which are capable of reducing a used amount of a washing gas and which are excellent in washing efficiency.

In addition, the invention has been made in consideration of the above-described circumstances, and another object thereof is to provide a vapor phase growth apparatus excellent in yield rate.

According to an aspect of the invention, there is provided a method for washing a semiconductor manufacturing apparatus component. The method includes: a first process of disposing a semiconductor manufacturing apparatus component, to which a nitride semiconductor expressed by a general formula of $Al_xIn_yGa_{1-x-y}N$ (provided that, x and y satisfy relationships of $0 \leq x < 1$, $0 \leq y < 1$, and $0 \leq x+y < 1$) adheres, inside an apparatus provided with a gas introducing pipe and a gas discharging pipe; a second process of setting the inside of the apparatus to a decompressed state, and then introducing a halogen-containing gas from the gas introducing pipe; and a third process of retaining the halogen-containing gas inside the apparatus to remove the nitride semiconductor adhered to the semiconductor manufacturing apparatus component. A pressure inside the apparatus in the third process is equal to or more than 10 kPa and equal to or less than 90 kPa.

According to this aspect, in the third process of removing the nitride semiconductor, since the pressure inside the apparatus is set to be equal to or more than 10 kPa, a reaction rate between the nitride semiconductor and the halogen-containing gas increases, and thus the nitride semiconductor adhered to the semiconductor manufacturing apparatus component may be efficiently removed. In addition, the pressure inside the apparatus is set to be equal to or less than 90 kPa, and thus an average free process of the reaction product of the nitride semiconductor and the halogen-containing gas may be lengthened. Accordingly, diffusion efficiency of the reaction product increases, and thus reaction efficiency between the nitride and the halogen-containing gas may be lengthened. As a result, a used amount of a washing gas which is necessary to remove the adhered nitride semiconductor may be reduced.

According to another aspect of the invention, there is provided an apparatus for washing a semiconductor manufacturing apparatus component to which a nitride semiconductor expressed by a general formula of $Al_xIn_yGa_{1-x-y}N$ (provided that, x and y satisfy relationships of $0 \leq x < 1$, $0 \leq y < 1$, and $0 \leq x+y < 1$) adheres. The apparatus includes: a component holding portion that holds the semiconductor manufacturing apparatus component; a gas introducing pipe that introduces a halogen-containing gas to react with the nitride semiconductor; a trapping unit that traps a reaction product of the nitride semiconductor and the halogen-containing gas; and a gas discharging pipe that discharges the reaction product.

According to this aspect, the trapping unit that traps the reaction product is provided to the washing apparatus, and the reaction product is trapped by the trapping unit. Accordingly, adhesion of the reaction product to the semiconductor manufacturing apparatus component or a not-preferred portion inside the washing apparatus may be suppressed. As a result, it is not necessary to continuously carry out introduction of the washing gas and removal of the reaction product, and a used amount of the washing gas which is necessary to remove the adhered nitride semiconductor may be reduced.

According to still another aspect of the invention, there is provided an vapor phase growth apparatus that supplies a first raw material gas containing gallium and a second raw material gas containing ammonia to a substrate inside a reaction tank to allow a nitride semiconductor expressed by a general formula of $Al_xIn_yGa_{1-x-y}N$ (provided that, x and y satisfy relationships of $0 \leq x < 1$, $0 \leq y < 1$, and $0 \leq x+y < 1$) to grow on the substrate. The apparatus includes: a substrate holding portion that holds the substrate; a gas introducing pipe that introduces a halogen-containing gas; a trapping unit that traps a reaction product of the nitride semiconductor and the halogen-containing gas; and a gas discharging pipe that discharges the reaction product.

According to the invention, a method for washing a semiconductor manufacturing apparatus component and an apparatus for washing a semiconductor manufacturing apparatus component, which are capable of reducing a used amount of a washing gas and which are excellent in washing efficiency, may be provided.

Furthermore, according to the invention, a vapor phase growth apparatus excellent in a yield rate may be provided.

BRIEF DESCRIPTION OF THE DRAWINGS

The above and other objects, advantages and features of the invention will become more apparent from the following description of certain preferred embodiments taken in conjunction with the accompanying drawings.

FIG. 1 shows a cross-sectional diagram illustrating a configuration of a washing apparatus according to a first embodiment.

FIG. 2 shows a cross-sectional diagram illustrating a configuration of the washing apparatus according to the first embodiment.

FIG. 3 shows a cross-sectional diagram illustrating a configuration of a washing apparatus according to a second embodiment.

FIG. 4 shows a cross-sectional diagram illustrating a configuration of the washing apparatus according to the second embodiment.

FIG. 5 shows a cross-sectional diagram illustrating a part of the configuration of the washing apparatus according to the second embodiment.

FIG. 6 shows a cross-sectional diagram illustrating a part of the configuration of the washing apparatus according to the second embodiment.

FIG. 7 shows a cross-sectional diagram illustrating a configuration of a vapor phase growth apparatus according to a third embodiment.

FIG. 8 shows a cross-sectional diagram illustrating a configuration of the vapor phase growth apparatus according to the third embodiment.

FIG. 9 shows a cross-sectional diagram illustrating a part of the configuration of the vapor phase growth apparatus according to the third embodiment.

FIG. 10 shows a cross-sectional diagram illustrating a part of the configuration of the vapor phase growth apparatus according to the third embodiment.

DESCRIPTION OF EMBODIMENTS

Hereinafter, embodiments of the invention will be described with reference to the attached drawings. In addi-

First Embodiment

<Washing Apparatus>

Hereinafter, an apparatus 100 for washing a semiconductor manufacturing apparatus component according to a first embodiment will be described, but the washing apparatus according to the first embodiment is not limited to the washing apparatus 100.

FIG. 1 shows a cross-sectional diagram illustrating a configuration of the washing apparatus according to the first embodiment. The washing apparatus 100 includes a component holding portion 102 that holds a semiconductor manufacturing apparatus component 101 to which a nitride semiconductor expressed by a general formula of $Al_xIn_yGa_{1-x-y}N$ (provided that, x and y satisfy relationships of $0 \leq x < 1$, $0 \leq y < 1$, and $0 \leq x+y < 1$) adheres, a reaction tank 103 that accommodates the component holding portion 102, a gas introducing pipe 104 that introduces a halogen-containing gas to react with the nitride semiconductor, and a gas discharging pipe 105 that discharges a reaction product generated in the reaction tank 103.

In addition, a heating device 106 that heats the inside of the reaction tank 103, and a pressure gauge 108 that monitors pressure inside the reaction tank 103 may be provided at the periphery of the reaction tank 103 as necessary.

A material of the reaction tank 103 is not particularly limited, but the reaction tank 103 is formed from, for example, a heat-resistant material such as quartz. The component holding portion 102 that holds the semiconductor manufacturing apparatus component 101 is provided inside the reaction tank 103.

In addition, although not particularly limited, the shape or size of the reaction tank 103 may be appropriately determined depending on the size of the semiconductor manufacturing apparatus component 101 to be washed or throughput thereof.

The component holding portion 102 is a member that holds the semiconductor manufacturing apparatus component 101, and is formed from, for example, a heat-resistant material such as carbon and quartz. The component holding portion 102 is configured to support the semiconductor manufacturing apparatus component 101 and to maintain the supported state. At this time, it is preferable to hold the semiconductor manufacturing apparatus component 101 in order for the entire surface thereof to be processed.

A configuration of holding the semiconductor manufacturing apparatus component 101 is not particularly limited, but for example, a configuration of providing a groove, into which a part of the semiconductor manufacturing apparatus component 101 is inserted, in the surface of the component holding portion 102 may be exemplified. The semiconductor manufacturing apparatus component 101 is pressed into the groove and is held therein.

In addition, a configuration of providing a hooking portion that hooks the semiconductor manufacturing apparatus component 101 in the component holding portion 102 is possible. The hooking-type component holding portion 102 hooks and holds the semiconductor manufacturing apparatus component 101, and thus a contact area between the semiconductor manufacturing apparatus component 101 and the component holding portion 102 may be made as small as possible. Accordingly, a non-washed portion of the semiconductor manufacturing apparatus component 101 may be made as small as possible.

In addition, a plurality of penetration holes may be formed in the component holding portion 102. When the plurality of penetration holes are formed, a halogen-containing gas supplied from a lower side easily flows to an upper side. According to this, the halogen-containing gas easily comes into contact with the semiconductor manufacturing apparatus component 101 that is held by the component holding portion 102. Accordingly, a washing process of the component holding portion 102 may be carried out in a more efficient manner. In addition, the shape of the penetration holes is not particularly limited as long as the component holding portion 102 has strength capable of holding the semiconductor manufacturing apparatus component 101. For example, the shape of the penetration holes may be a rectangle or circle. In addition, in addition to the formation of the penetration holes in the component holding portion 102, the component holding portion 102 may be formed in a lattice shape.

The halogen-containing gas is introduced from a container 109 in which the halogen-containing gas is filled to the inside of the reaction tank 103 through the gas introducing pipe 104. In addition, according to necessity, along with the introduction of the halogen-containing gas, an inert gas may be introduced from a container 110 in which the inert gas is filled to the inside of the reaction tank 103 so as to regulate a concentration of the halogen-containing gas. At this time, an introduction amount of each of the halogen-containing gas and the inert gas may be regulated by the gas introducing valve 111.

The gas discharging pipe 105 is connected to a vacuum pump 113 through a gas discharging valve 112, and thus the inside of the reaction tank 103 may be set to a decompressed state. In addition, the gas discharging pipe 105 and the vacuum pump 113 may be connected to an exhaust gas elimination processing device (not shown) as necessary, and thus the reaction product discharged from the reaction tank 103 may be discharged to the air after being detoxified.

In addition, FIG. 1 illustrates the gas introducing pipe 104 and the gas discharging pipe 105 are connected to a lower portion of the reaction tank 103, but these members may be connected to a side portion or an upper portion of the reaction tank 103, and a connection portion is not particularly limited.

Although not particularly limited, the heating device 106 includes, for example, a heating unit capable of heating the inside of the reaction tank 103, and a temperature regulator which is capable of regulating an output of the heating unit to maintain the inside of the reaction tank 103 at a constant temperature. Although not particularly limited, as the heating unit, a known heating unit such a heating wire and lamp heating may be used, and an arbitrary unit capable of heating the semiconductor manufacturing apparatus component 101 may be used.

In addition, as shown in FIG. 2, the washing apparatus 100 may further include a recovery unit 114 that recovers a nitride semiconductor from the discharged reaction product. For example, the recovery unit 114 includes a recovery portion 115 that is connected to the gas discharging pipe 105, and a container 116 in which an $NH_3$ (ammonia) gas is filled. The discharged reaction product is trapped inside the recovery portion 115. Furthermore, the recovery portion 115 is connected to the container 116, and according to this, the $NH_3$ gas may be introduced to the inside of the recovery portion 115.

Although not particularly limited, the recovery portion 115 is formed from, for example, a material such as carbon, quartz, stainless steel, hastelloy, carbon nitride, silicon nitride, boron nitride, and borosilicon nitride which have heat resistance, and corrosion resistance against the halogen-containing gas. In addition, for example, an introduction port capable of introducing a reaction product, an introduction port capable of introducing an $NH_3$ gas, and an exhaust port capable of discharging an exhaust gas are provided to the recovery portion 115.

Although not particularly limited, as the semiconductor manufacturing apparatus component 101, a component of an MOCVD apparatus or the like which is an apparatus of manufacturing a nitride semiconductor, and in which contamination due to an adhesion is severe is applicable. Particularly, application of components such as susceptor and a wafer tray which are at the periphery of a reaction furnace is effective.

<Washing Method>

Next, a method for washing the semiconductor manufacturing apparatus component 101 to which a nitride semiconductor adheres by using the washing apparatus 100 will be described. A method for washing the semiconductor manufacturing apparatus component 101 according to the first embodiment includes a first process of disposing the semiconductor manufacturing apparatus component 101, to which a nitride semiconductor adheres, inside the reaction tank 103, a second process of setting the inside of the reaction tank 103 to a decompressed state, and then introducing a halogen-containing gas from the gas introducing pipe 104, and a third process of retaining the halogen-containing gas inside the reaction tank 103 to remove the nitride semiconductor adhered to the semiconductor manufacturing apparatus component 101. Here, a pressure inside the reaction tank 103 in the third process is equal to or more than 10 kPa and equal to or less than 90 kPa.

Hereinafter, each of the processes will be described in detail.

(First Process)

First, the semiconductor manufacturing apparatus component 101, to which the nitride semiconductor adheres, inside the semiconductor apparatus is taken out, and is disposed in the component holding portion 102 inside the reaction tank 103. At this time, the number of the semiconductor manufacturing apparatus components 101 is not particularly limited, but one or more components may be disposed.

Next, the inside of the reaction tank 103 is heated by the heating device 106 to a desired temperature to be described later, and is further set to a decompressed state by the vacuum pump 113. Here, the pressure inside the reaction tank 103 is preferably equal to or less than 1 kPa, and more preferably equal to or less than 0.1 kPa. When the pressure is set to be equal to or less than the upper limit, an amount of the halogen-containing gas to be introduced may be increased, and an unpreferred side reaction due to a residual gas may be suppressed, and thus the reaction product may be removed in a more efficient manner.

Here, heating may be carried out after setting the inside of the reaction tank 103 to a decompressed state, or the heating operation and the decompression operation may be carried out simultaneously. The sequence of the heating operation and the decompression operation is not particularly limited as long as the inside finally reaches the above-described temperature and the pressure.

(Second Process)

When the inside of the reaction tank 103 reaches a desired pressure, the gas introducing valve 111 is opened to introduce the halogen-containing gas to the inside of the reaction tank 103.

As the halogen-containing gas, for example, one kind of compound such as $Cl_2$, HCl, $SiCl_4$, $SiHCl_3$, $SiH_2Cl_2$, $SiH_3Cl$, $BCl_3$, $CHCl_3$, $CH_2Cl_2$, and $CH_3Cl$ which contain chlorine in a molecule, or a mixture of two or more kinds of these compounds is used. Among these, $Cl_2$ is particularly preferable from the viewpoint of the balance in price, reactivity, and the like.

In addition, an inert gas may be introduced from the container 110 to the inside of the reaction tank 103 together with the introduction of the halogen-containing gas as necessary. Due to the introduction of the inert gas, a concentration of the halogen-containing gas may be regulated.

As the inert gas, for example, any one kind of gas such as nitrogen, helium, and argon which does not react with the halogen-containing gas, or a mixed gas of two or more kinds of the gases may be used.

In addition, a concentration of the halogen-containing gas inside the reaction tank 103 when introducing the inert gas is not particularly limited. However, when the concentration is too high, the semiconductor manufacturing apparatus component itself may be corroded in some cases, and thus the concentration is appropriately set depending on the kind of the component.

The concentration of the halogen-containing gas inside the reaction tank 103 when introducing the inert gas is not particularly limited, but it is preferable that the concentration be equal to or more than 5% by volume, and more preferably equal to or more than 10% by volume. When the concentration is set to be equal to or more than the lower limit, a reaction rate between the nitride semiconductor and the halogen-containing gas increases, and thus the nitride semiconductor adhered to the semiconductor manufacturing apparatus component may be removed in a more efficient manner.

The concentration of the halogen-containing gas is not particularly limited, but it is preferable that the concentration be equal to or less than 100% by volume, and more preferably equal to or less than 80% by volume. When the concentration is set to be equal to or less than the upper limit, the amount of the halogen-containing gas may be less, and thus corrosion of components constituting an apparatus may be suppressed.

(Third Process)

After the inside of the reaction tank 103 reaches desired temperature and pressure, the halogen-containing gas is retained inside the reaction tank 103 for a constant time. At this time, the nitride semiconductor adhered to the semiconductor manufacturing apparatus component 101 react with the halogen-containing gas, and thus a reaction product such as gallium halide is generated. The reaction product immediately evaporates to a vapor, and this vapor floats inside the reaction tank 103.

The internal pressure of the reaction tank 103 in the third process is equal to or more than 10 kPa, preferably equal to or more than 12 kPa, and more preferably equal to or more than 15 kPa. When the internal pressure is set to be equal to or more than the lower limit, a reaction rate between the nitride semiconductor and the halogen-containing gas increases, and thus the nitride semiconductor adhered to the semiconductor manufacturing apparatus component may be efficiently removed.

In addition, the internal pressure is equal to or less than 90 kPa, preferably equal to or less than 85 kPa, and more preferably equal to or less than 80 kPa. When the internal pressure is set to be equal to or less than the upper limit, an average free process of the reaction product may be lengthened, and thus diffusion efficiency of the reaction product increases. As a result, reaction efficiency between the nitride and the halogen-containing gas may increase.

Accordingly, it is not necessary to continuously carry out introduction of the washing gas and removal of the reaction product, and a used amount of the washing gas which is necessary to remove the adhered nitride semiconductor may be reduced.

The internal temperature of the reaction tank 103 in the third process is not particularly limited, it is preferable that the internal temperature be equal to or higher than 500° C., and more preferably equal to or higher than 750° C. When the internal temperature is set to be equal to or higher than the lower limit, a volatilization rate of the reaction product increases, and thus the nitride semiconductor adhered to the semiconductor manufacturing apparatus component may be removed in a more efficient manner.

In addition, although not particularly limited, it is preferable that the internal temperature be equal to or lower than 1000° C., and more preferably equal to or lower than 800° C. When the internal temperature is set to be equal to or lower than the upper limit, thermal deformation of the semiconductor manufacturing apparatus component 101 may be further prevented.

Although not particularly limited, a retention time of the halogen-containing gas in the third process is appropriately set depending on the size of the reaction tank 103, the throughput of the semiconductor manufacturing apparatus component 101, and the like.

In addition, the gas introducing valve 111 and the gas discharging valve 112 are preferably completely closed in the third process to maintain sealability, but may not be closed. For example, the gas introducing valve 111 and the gas discharging valve 112 may be regulated in order for the internal pressure of the reaction tank 103 to satisfy the above-described pressure range.

(Fourth Process)

In addition, in the method for washing the semiconductor manufacturing apparatus component 101 according to the first embodiment, it is preferable to further carry out a fourth process of removing the reaction product of the nitride semiconductor and the halogen-containing gas. Specifically, the halogen-containing gas is retained inside the reaction tank 103 for a constant time, and the gas discharging valve 112 is opened to remove the vapor of the reaction product from the gas discharging pipe 105.

At this time, more preferably, after the inside of the reaction tank 103 is returned to the atmospheric pressure by opening the gas introducing pipe 104 to introduce the inert gas from the container 110 to the reaction tank 103, a vapor of the reaction product is discharged. When the inert gas is introduced, the vapor of the reaction product is pushed out by the inert gas, and thus vapor may be discharged in a more efficient manner. At this time, although not particularly limited, as the inert gas that is used, the above-described inert gas may be used, or other gases may be used.

In addition, in the method for washing the semiconductor manufacturing apparatus component 101 according to the first embodiment, from the second process to the fourth process are preferably carried out two or more times. When the processes are carried out two or more times, the surface of the semiconductor manufacturing apparatus component 101 is more activated, and thus reaction efficiency between the nitride and the halogen-containing gas may be further raised. Although not particularly limited, the number of repetitions is appropriately set depending on the size of the reaction tank 103, the throughput of the semiconductor manufacturing apparatus component 101, or the like.

(Fifth Process)

In addition, in the method for washing the semiconductor manufacturing apparatus component 101 according to the first embodiment, it is preferable to further carry out a fifth process of recovering a gallium compound from the reaction product. The recovery method is not particularly limited. However, for example, as shown in FIG. 2, a vapor of the reaction product discharged from the gas discharging pipe 105 is trapped by the recovery portion 115. Then, an $NH_3$ gas is introduced from the container 116 to the recovery portion 115 to allow the reaction product and the $NH_3$ gas to react with each other, thereby generating a solid such as a gallium compound. Since the fifth process is carried out, an amount of the exhaust gas that is harmful may be reduced.

Hereinbefore, the first embodiment of the invention has been described with reference to the drawings, but the drawings are illustrative only, and various configurations other than that of the drawings may be employed.

In the first embodiment, a case in which the vacuum pump 113 is connected to the gas discharging pipe 105 has been illustrated, but a configuration in which the vacuum pump 113 is connected to other portions may be employed.

In addition, in the first embodiment, a case in which the semiconductor manufacturing apparatus component 101 is washed has been described, but the main body of the semiconductor manufacturing apparatus may be disposed inside the reaction tank 103 and may be washed therein. However, in this case, it is necessary to pay attention in order for the semiconductor manufacturing apparatus itself not to be damaged.

In addition, after the fourth process, it is possible to employ a configuration of further carrying out a process of introducing a mixed gas of a hydrogen-based gas such as hydrogen, methane, and ethane which include hydrogen in a molecule, and an inert gas such as argon, helium, and nitrogen that dilutes the hydrogen-based gas so as to remove a halogen compound that remains in a state of adhering to a component.

Second Embodiment

Next, a washing apparatus 100 according to a second embodiment will be described. The second embodiment is basically the same as the washing apparatus 100 according to the first embodiment except that a trapping unit 117 traps a reaction product of the nitride semiconductor and the halogen-containing gas. Accordingly, in the second embodiment, description will be focused to portions different from the first embodiment, and description of common portions will not be repeated.

<Washing Apparatus>

FIG. 3 shows a cross-sectional diagram illustrating a configuration of a washing apparatus according to a second embodiment. The washing apparatus 100 includes a component holding portion 102 that holds a semiconductor manufacturing apparatus component 101 to which a nitride semiconductor expressed by a general formula of $AlIn_y Ga_{1-x-y}N$ (provided that, x and y satisfy relationships of $0 \leq x < 1$, $0 \leq y < 1$, and $0 \leq x+y < 1$) adheres, a reaction tank 103 that accommodates a component holding portion 102, a gas introducing pipe 104 that introduces a halogen-containing gas to react with the nitride semiconductor, a trapping unit 117 that traps a reaction product of the nitride semiconductor and the halogen-containing gas, and a gas discharging pipe 105 that discharges the reaction product.

As shown in FIG. 4, preferably, the washing apparatus 100 further includes a washing processing portion 118, and a cooling portion 119 that cools the trapping unit 117, and the washing apparatus 100 has a configuration in which the component holding portion 102 is disposed inside the washing processing portion 118, and the trapping unit 117 is disposed inside the cooling portion 119.

Since the washing apparatus 100 has this configuration, a washing process of the semiconductor manufacturing apparatus component, and trapping of the reaction product are clearly classified. Furthermore, a vapor of the reaction product trapped by the trapping unit 117 is cooled by the cooling portion 119, and the reaction product may be allowed to precipitate. Accordingly, adhesion of the reaction product to the semiconductor manufacturing apparatus component or a not-preferred portion inside the washing apparatus may be further suppressed, and thus reaction product may be trapped in a more efficient manner.

In addition, the trapping unit 117 is not particularly limited, but a cooling panel is preferable. When using the cooling panel, the vapor of the reaction product may be cooled in a more efficient manner, and thus the reaction product may be trapped in a more efficient manner.

In addition, although not particularly limited, it is preferable that the trapping unit 117 be formed from, for example, a material such as carbon, quartz, stainless steel, hastelloy, silicon carbide, silicon nitride, and boron nitride which do not react with the reaction product. Particularly, quartz is preferable from the viewpoint of excellent heat resistance. The reaction stated here represents an irreversible reaction such as corrosion. However, a case of simple precipitation and a case of absorption are not included in the reaction.

In addition, it is preferable that the cooling portion 119 have a function of regulating a temperature of the inside of the trapping unit 117. When being converted into a high temperature after trapping the reaction product at a low temperature, the trapped reaction product may be converted into a vapor again. Accordingly, the reaction product may be discharged from the gas discharging pipe 105 in a more efficient manner.

As the function of regulating the temperature inside the trapping unit 117, for example, a function of a temperature control fluid circulator 120 and the like may be exemplified. For example, when water is allowed to flow from the temperature control fluid circulator 120 to the cooling portion 119, the cooling portion 119 may be set to a low temperature. In addition, for example, when oil is allowed to flow from the temperature control fluid circulator 120, the cooling portion 119 may be set to a high temperature.

A temperature of the water that cools the cooling portion 119 is preferably equal to or higher than 0° C. and equal to or lower than 40° C. In addition, a temperature of the oil that makes the cooling portion 119 warm is preferably equal to or higher than 80° C. and equal to or lower than 200° C.

With regard to a connection portion of the gas introducing pipe 104, FIG. 3 illustrates that the gas introducing pipe 104 is connected to an upper portion of the reaction tank 103, but the gas introducing pipe 104 may be connected to a side portion or a lower portion of the reaction tank 103, and the connection portion is not particularly limited.

In addition, a connection portion of the gas discharging pipe 105 is not particularly limited, but the gas discharging pipe 105 is preferably connected to the trapping unit 117. According to this connection, the reaction product trapped by the trapping unit 117 may be efficiently discharged.

In addition, as shown in FIG. 5, the washing apparatus 100 may further include a recovery unit 114 that recovers a nitride semiconductor from the reaction product that is discharged. For example, the recovery unit 114 includes a recovery portion 115 that is connected to the gas discharging pipe 105, and a container 116 in which an $NH_3$ (ammonia) gas is filled, and the reaction product that is discharged is trapped inside the recovery portion 115. Furthermore, the recovery portion 115 is connected to the container 116, and thus the ammonia gas may be introduced to the inside of the recovery portion 115.

Although not particularly limited, the recovery portion 115 may be formed from, for example, a material such as carbon, quartz, stainless steel, hastelloy, carbon nitride, silicon nitride, boron nitride, and borosilicon nitride which have heat resistance, and corrosion resistance against the halogen-containing gas. In addition, for example, an introduction port capable of introducing the reaction product, an introduction port capable of introducing the ammonia gas, and an exhaust port capable of discharging an exhaust gas are provided to the recovery portion 115.

In addition, in the washing apparatus 100, as shown in FIG. 6, a plurality of traps 121 may be provided between the gas discharging pipe 105 and the recovery portion 115. The traps 121 may collect the reaction product discharged from the gas discharging pipe 105.

In addition, in a case where the washing apparatus 100 includes the recovery unit 114, it is preferable that a distance from the gas discharging pipe 105 to the traps 121 or the recovery portion 115 be short. When the distance is made to be short, a distance at which the vapor of the reaction product diffuses may be made to be short, and thus the vapor may be further prevented from precipitating midway.

Although not particularly limited, as the semiconductor manufacturing apparatus component 101, a component of an MOCVD apparatus or the like which is an apparatus of manufacturing a nitride semiconductor, and in which contamination due to an adhesion is severe is applicable. Particularly, application of components such as susceptor and a wafer tray which are at the periphery of a reaction furnace is effective.

<Washing Method>

Next, a method for washing the semiconductor manufacturing apparatus component 101 to which a nitride semiconductor adheres by using the washing apparatus 100 according to the second embodiment will be described, but the washing method according to the second embodiment is not limited thereto. In addition, description will also be focused to portions different from the first embodiment, and description of common portions will not be repeated.

The method for washing the semiconductor manufacturing apparatus component 101 according to the second embodiment includes a first process of disposing the semiconductor manufacturing apparatus component 101, to which a nitride semiconductor adheres, inside an apparatus, a second process of introducing the halogen-containing gas from the gas introducing pipe 104 to remove the nitride semiconductor adhered to the semiconductor manufacturing apparatus component 101, and a third process of trapping the reaction product that is generated in the reaction between the halogen-containing gas and the nitride semiconductor.

Hereinafter, each of the processes will be described in detail, but each of the processes is not limited thereto.

(First Process)

First, the semiconductor manufacturing apparatus component 101, to which the nitride semiconductor adheres, inside the semiconductor apparatus is taken out, and is disposed in the component holding portion 102 inside the reaction tank 103. In a case where the washing apparatus 100 further includes the washing processing portion 118 and the cooling portion 119, the component holding portion 102 is disposed inside the washing processing portion 118. At this time, the number of the semiconductor manufacturing apparatus components 101 that are disposed is not particularly limited, but one or more components may be disposed.

Next, the inside of the reaction tank 103 or the washing processing portion 118 is heated by a heating device 106 to a desired temperature to be described later as necessary. Here, the inside of the reaction tank 103 or the washing processing portion 118 may be further set to a decompressed state by a vacuum pump 113.

At this time, the pressure inside the reaction tank 103 or the washing processing portion 118 is preferably equal to or less than 1 kPa, and more preferably equal to or less than 0.1 kPa. When the pressure is set to be equal to or less than the upper limit, an amount of the halogen-containing gas to be introduced may be increased, and an unpreferred side reaction due to a residual gas may be suppressed, and thus the reaction product may be removed in a more efficient manner.

Here, heating may be carried out after setting the inside of the reaction tank 103 to a decompressed state, or the heating operation and the decompression operation may be carried out simultaneously. The sequence of the heating operation and the decompression operation is not particularly limited as long as the inside finally reaches the above-described temperature and the pressure.

(Second Process)

When the inside of the reaction tank 103 reaches desired temperature and pressure, a gas introducing valve 111 is opened, and a halogen-containing gas is introduced to the inside of the reaction tank 103. The same halogen-containing gas as the first embodiment may be used.

In the second process, the nitride semiconductor adhered to the semiconductor manufacturing apparatus component 101 reacts with the halogen-containing gas, whereby a reaction product such as gallium halide is generated. The reaction product immediately evaporates to a vapor, and this vapor floats inside the reaction tank 103 or the washing processing portion 118 and the trapping unit 117.

At this time, it is preferable that the halogen-containing gas be retained inside the apparatus by closing the gas introducing valve 111 and the gas discharging valve 112 so as to allow a reaction between the halogen-containing gas and the nitride semiconductor to occur. When the halogen-containing gas is retained inside the apparatus, a reaction rate between the halogen-containing gas and the nitride semiconductor may be improved, and thus a used amount of the halogen-containing gas may be further reduced. However, the gas introducing valve 111 and the gas discharging valve 112 may not be completely closed.

In the case of retaining the halogen-containing gas inside the apparatus, after the inside of the reaction tank 103 or the washing processing portion 118 reaches a desired pressure, the gas introducing valve 111 is closed to retain the halogen-containing gas inside the reaction tank 103 or the washing processing portion 118 and the trapping unit 117 for a constant time.

The internal pressure of the reaction tank 103 or the washing processing portion 118 in the second process is preferably equal to or more than 10 kPa, and more preferably equal to or more than 12 kPa. When the internal pressure is set to be equal to or more than the lower limit, a reaction rate between the nitride semiconductor and the halogen-containing gas increases, and thus the nitride adhered to the semiconductor manufacturing apparatus component may be removed in more efficient manner.

In addition, the internal pressure is preferably equal to or less than 90 kPa, and more preferably equal to or less than 85 kPa. When the internal pressure is set to be equal to or less than the upper limit, the average free process of the reaction product may be lengthened, and thus diffusion efficiency of the reaction product increases. As a result, reaction efficiency between the nitride and the halogen-containing gas may further increase.

Although not particularly limited, the internal temperature of the reaction tank 103 or the washing processing portion 118 in the second process is preferably equal to or higher than 500° C., and more preferably equal to or higher than 750° C. When the internal temperature is set to be equal to or higher than the lower limit, a volatilization rate of the reaction product increases, and thus the nitride semiconductor adhered to the semiconductor manufacturing apparatus component may be removed in a more efficient manner.

In addition, although not particularly limited, it is preferable that the internal temperature be equal to or lower than 1000° C., and more preferably equal to or lower than 800° C. When the internal temperature is set to be equal to or lower than the upper limit, thermal deformation of the semiconductor manufacturing apparatus component 101 may be further prevented.

Although not particularly limited, a retention time of the halogen-containing gas in the second process is appropriately set depending on the size of the reaction tank 103, the throughput of the semiconductor manufacturing apparatus component 101, and the like.

(Third Process)

Continuously, the reaction product generated by the reaction between the halogen-containing gas and the nitride semiconductor is trapped by the trapping unit 117. For example, water supplied from the temperature control fluid circulator 120 is allowed to flow the cooling portion 119, thereby cooling the trapping unit 117. In this case, the vapor of the reaction product is cooled at the inside of the trapping unit 117, and precipitates to the surface of the trapping unit 117, and is trapped thereon.

In addition, the second process and the third process are preferably carried out simultaneously.

After the halogen-containing gas is retained inside the reaction tank 103 or the washing processing portion 118 for a constant time, the gas discharging valve 112 is opened to discharge an exhaust gas such as an unreacted halogen-containing gas and not-trapped gas from the gas discharging pipe 105.

At this time, more preferably, after the inside of the reaction tank 103 is returned to the atmospheric pressure by opening the gas introducing pipe 104 to introduce the inert gas from the container 110 to the reaction tank 103, the exhaust gas is discharged. When the inert gas is introduced, the exhaust gas is pushed out by the inert gas, and thus exhaust gas may be discharged in a more efficient manner. At this time, although not particularly limited, as the inert gas that is used, the above-described inert gas may be used, or other gases may be used.

In addition, in the method for washing the semiconductor manufacturing apparatus component 101 using the washing apparatus 100 according to the second embodiment, from the introduction of the halogen-containing gas to the discharging of the exhaust gas are preferably carried out two or more times. When the processes are carried out two or more times, the surface of the semiconductor manufacturing apparatus component 101 is further activated, and thus reaction efficiency between the nitride and the halogen-containing gas may be further raised. Although not particularly limited, the number of repetitions is appropriately set depending on the size of the reaction tank 103 or the washing processing portion 118, the throughput of the semiconductor manufacturing apparatus component 101, or the like.

(Fourth Process)

In addition, in the method for washing the semiconductor manufacturing apparatus component 101 using the washing apparatus 100 according to the second embodiment, it is preferable to further carry out a fourth process of discharging the trapped reaction product. A method of discharging the reaction product is not particularly limited, but for example, high-temperature oil is allowed to flow from the temperature control fluid circulator 120 to the cooling portion 119 so as to make the trapping unit 117 warm. In this case, the reaction product precipitated on the surface of the trapping unit 117 is converted into a vapor again, and is discharged from the gas discharging pipe 105.

At this time, more preferably, after the inside of the reaction tank 103 is returned to the atmospheric pressure by opening the gas introducing pipe 104 to introduce the inert gas from the container 110 to the reaction tank 103, a vapor of the reaction product is discharged. When the inert gas is introduced, the vapor of the reaction product is pushed out by the inert gas, and thus vapor may be discharged in a more efficient manner. At this time, although not particularly limited, as the inert gas that is used, the above-described inert gas may be used, or other gases may be used.

In addition, in the method for washing the semiconductor manufacturing apparatus component 101 using the washing apparatus 100 according to the second embodiment, it is preferable that the fourth process be carried out after the first process to the third process are repetitively carried out to collect a constant amount of the reaction product that is trapped by the trapping unit 117. Although not particularly limited, the number of repetitions is appropriately set depending on a trapped amount of the reaction product.

(Fifth Process)

In addition, in the method for washing the semiconductor manufacturing apparatus component 101 using the washing apparatus 100 according to the second embodiment, it is preferable to further carry out a fifth process of recovering a gallium compound from the reaction product. The recovering method is not particularly limited, but may be carried out using, for example, an apparatus shown in FIG. 5. First, a vapor of the reaction product discharged from the gas discharging pipe 105 is trapped by the recovery portion 115. Then, the ammonia gas is introduced from the container 116 to the recovery portion 115 to allow a gallium halide contained in the reaction product and the ammonia to react with each other, thereby generating a solid of the gallium compound and the like. When the fifth process is carried out, an amount of the exhaust gas that is harmful may be reduced.

In addition, in the washing apparatus 100, as shown in FIG. 6, the reaction product may be transmitted to the recovery portion 115 after trapping and collecting a constant amount of discharged reaction product by a plurality of traps 121 provided between the gas discharging pipe 105 and the recovery portion 115. According to this configuration, a process of recovering the gallium compound may be carried out in stages.

Hereinbefore, the embodiment of the invention has been described with reference to the drawings, but the drawings are illustrative only, and various configurations other than that of the drawings may be employed.

In the second embodiment, a case in which the vacuum pump 113 is connected to the gas discharging pipe 105 has been illustrated, but a configuration in which the vacuum pump 113 is connected to other portions may be employed.

In addition, in the second embodiment, a case in which the semiconductor manufacturing apparatus component 101 is washed has been described, but the main body of the semiconductor manufacturing apparatus may be disposed inside the reaction tank 103 and may be washed therein. However, in this case, it is necessary for attention to be paid in order for the semiconductor manufacturing apparatus itself not to be damaged.

Third Embodiment

<Vapor Phase Growth Apparatus>

Next, a vapor phase growth apparatus 200 according to a third embodiment will be described.

First, a configuration of the vapor phase growth apparatus 200 according to the third embodiment will be described. FIG. 7 shows a cross-sectional diagram illustrating a configuration of the vapor phase growth apparatus 200 according to the third embodiment.

The vapor phase growth apparatus 200 is an apparatus that supplies a first raw material gas containing gallium and a second raw material gas containing ammonia to a substrate 201 inside a reaction tank 203 to allow a nitride semiconductor expressed by a general formula of $Al_xIn_yGa_{1-x-y}N$ (provided that, x and y satisfy relationships of $0 \leq x < 1$, $0 \leq y < 1$, and $0 \leq x+y < 1$) to grow on the substrate 201. In addition, the vapor phase growth apparatus 200 includes the reaction tank 203, a substrate holding portion 202, a gas introducing pipe 204, a trapping unit 217, and a gas discharging pipe 205.

The first raw material gas containing gallium, or the second raw material gas containing ammonia may be supplied from the gas introducing pipe 204 toward the substrate 201. Furthermore, a halogen-containing gas may be introduced from the gas introducing pipe 204 to the inside of the reaction tank 203 to remove a contaminant adhered to various components inside the vapor phase growth apparatus 200. The removed contaminant may be discharged from the gas discharging pipe 205.

In addition, in the vapor phase growth apparatus 200, a heating device 206 that heats the inside of the reaction tank 203, and a pressure gauge 208 that monitors a pressure inside the reaction tank 203 may be provided at the periphery of the reaction tank 203 as necessary.

A material of the reaction tank 203 is not particularly limited, but the reaction tank 203 is formed from, for example, a heat-resistant material such as quartz. The substrate holding portion 202 is disposed inside the reaction tank 203, and the substrate 201 on which the nitride semiconductor is allowed to grow is disposed on the substrate holding portion 202.

In addition, although not particularly limited, the shape or size of the reaction tank 203 may be appropriately determined depending on the size of the substrate 201 or throughput.

The trapping unit 217 takes on a role of trapping a reaction product that is generated by reaction between a contaminant such as GaN, and the halogen-containing gas. When a nitride semiconductor is manufactured using a vapor phase growth apparatus of the related art, the contaminant such as GaN is apt to adhere to various components such as a tray that supports the substrate and a gas flow channel other than the substrate. Therefore, it is necessary for the contaminated component to be washed once before manufacturing a new semiconductor.

On the other hand, in the vapor phase growth apparatus 200 according to the third embodiment, after manufacturing a nitride semiconductor, a halogen-containing gas is introduced to the reaction tank 203 through the gas introducing pipe 204 to carry out washing of various components inside the reaction tank 203 within the vapor phase growth apparatus 200.

At this time, the trapping unit 217 takes on a role of trapping a reaction product between the halogen-containing gas and the contaminant. Since the reaction product is trapped by the trapping unit 217, adhesion of the reaction product to other components may be suppressed, and thus the adhered contaminant may be efficiently removed. Accordingly, in the vapor phase growth apparatus 200 provided with the trapping unit 217, it is not necessary for the contaminated component to be detached and washed once, and thus the nitride semiconductor product may be manufactured with a good yield rate.

As shown in FIG. 8, preferably, the vapor phase growth apparatus 200 further includes a cooling portion 219 that cools the trapping unit 217, and vapor phase growth apparatus 200 has a configuration in which the substrate holding portion 202 is disposed inside the reaction tank 203, and the trapping unit 217 is disposed inside the cooling portion 219.

Since the vapor phase growth apparatus 200 has this configuration, a washing process of the component inside the vapor phase growth apparatus 200, and trapping of the reaction product are clearly classified. Furthermore, a vapor of the reaction product trapped by the trapping unit 217 is cooled by the cooling portion 219, and the reaction product may be allowed to precipitate. Accordingly, adhesion of the reaction product to components inside the vapor phase growth apparatus 200 may be further suppressed, and thus the reaction product may be trapped in a more efficient manner.

The trapping unit 217 is not particularly limited as long as the trapping unit 217 can trap the reaction product, but a cooling panel is preferable. When using the cooling panel, the vapor of the reaction product may be cooled in a more efficient manner, and thus the reaction product may be trapped in a more efficient manner.

In addition, although not particularly limited, it is preferable that the trapping unit 217 be formed from, for example, a material such as carbon, quartz, stainless steel, hastelloy, silicon carbide, silicon nitride, and boron nitride which do not react with the reaction product. Particularly, quartz is preferable from the viewpoint of excellent heat resistance. The reaction stated here represents an irreversible reaction such as corrosion. However, a case of simple precipitation and a case of absorption are not included in the reaction.

In addition, it is preferable that the cooling portion 219 have a function of regulating a temperature of the inside of the trapping unit 217. When being converted into a high temperature after trapping the reaction product at a low temperature, the trapped reaction product may be converted into a vapor again. Accordingly, the reaction product may be discharged from the gas discharging pipe 205 in a more efficient manner.

As the function of regulating the temperature inside the trapping unit 217, for example, a function of a temperature control fluid circulator 220 and the like may be exemplified. When cooling water is allowed to flow from the temperature control fluid circulator 220 to the cooling portion 219, the cooling portion 219 may be set to a low temperature. In addition, when oil is allowed to flow from the temperature control fluid circulator 220, the cooling portion 119 may be set to a high temperature.

A temperature of the cooling water that cools the cooling portion 219 is preferably equal to or higher than 0° C. and equal to or lower than 40° C. In addition, a temperature of the oil that makes the cooling portion 219 warm is preferably equal to or higher than 80° C. and equal to or lower than 200° C.

The substrate holding portion 202 is a member that holds the substrate 201, and is formed from, for example, a heat-resistant material such as carbon and quartz. The substrate holding portion 202 is configured to support the substrate 201 and to maintain the supported state.

The first raw material gas containing gallium or the second raw material gas containing ammonia is introduced from a first raw material gas generating chamber 223 or a container 218 in which the second raw material gas is filled to the inside of the reaction tank 203 through the gas introducing pipe 204. At this time, an introduction amount of each of the first raw material gas and the second raw material gas may be regulated by a gas introducing valve 211.

The halogen-containing gas is introduced from a container 210 in which the halogen-containing gas is filled to the inside of the reaction tank 203 through the gas introducing pipe 204. In addition, according to necessity, together with the introduction of the halogen-containing gas, an inert gas may be introduced from a container 222 in which the inert gas is filled so as to regulate a concentration of the halogen-containing gas. At this time, an introduction amount of each of the halogen-containing gas and the inert gas may be regulated by the gas introducing valve 211.

One port of the gas introducing pipe 204 is connected to the inside of the reaction tank 203, and the other port is connected to the container 210 in which the halogen-containing gas is filled, the first raw material gas generating chamber 223, the container 218 in which the second raw material gas is filled, and the container 222 in which the inert gas is filled.

The gas discharging pipe 205 is connected to a vacuum pump 213 through a gas discharging valve 212, and according to this, the inside of the reaction tank 203 may be set to a decompressed state. Furthermore, the gas discharging pipe 205 and the vacuum pump 213 may be connected to an exhaust gas elimination processing device (not shown) as necessary, and thus the reaction product discharged from the reaction tank 203 may be discharged to the air after being detoxified.

With regard to a connection portion of the gas introducing pipe 204, FIGS. 7 and 8 illustrate that the gas introducing pipe 204 is connected to an upper portion of the reaction tank 203, but the gas introducing pipe 204 may be connected to a side portion or a lower portion of the reaction tank 203, and the connection portion is not particularly limited. In addition, a case in which one of the gas introducing pipe 204 is provided for the respective gases is shown. However, it is not necessary for the gas introducing pipe 204 to be one. With regard to the gas introducing pipe 204, a gas introducing pipe dedicated for each gas may be provided, and a common gas introducing pipe as shown in FIGS. 7 and 8 is also possible.

A connection site of the gas discharging pipe 205 is not particularly limited, but the gas discharging pipe 205 is preferably connected to the trapping unit 217 as shown in FIGS. 7 and 8. According to this connection, the reaction product trapped by the trapping unit 217 may be efficiently discharged.

Although not particularly limited, for example, the heating device 206 includes a heating unit that heats the inside of the reaction tank 203, and a temperature regulator which is capable of regulating an output of the heating unit to maintain the inside of the reaction tank 203 at a constant temperature. Although not particularly limited, as the heating unit, a known heating unit such as a heating wire and lamp heating may be used, and an arbitrary unit capable of heating the inside of the vapor phase growth apparatus 200 may be used.

In addition, as shown in FIG. 9, the vapor phase growth apparatus 200 according to the third embodiment may further include a recovery unit 214 that recovers a gallium compound from the discharged reaction product. For example, the recovery unit 214 includes a recovery portion 215 that is connected to the gas discharging pipe 205, and a container 216 in which ammonia is filled. The discharged reaction product is trapped inside the recovery portion 215. Furthermore, the recovery portion 215 is connected to the container 216, and according to this, the ammonia may be introduced to the inside of the recovery portion 215.

Although not particularly limited, the recovery portion 215 is formed from, for example, a material such as carbon, quartz, stainless steel, hastelloy, carbon nitride, silicon nitride, boron nitride, and borosilicon nitride which have heat resistance, and corrosion resistance against the halogen-containing gas. In addition, for example, an introduction port capable of introducing a reaction product, an introduction port capable of introducing the ammonia, and an exhaust port capable of discharging an exhaust gas are provided to the recovery portion 215.

In addition, in the vapor phase growth apparatus 200, as shown in FIG. 10, a plurality of traps 221 may be provided between the gas discharging pipe 205 and the recovery portion 215. The traps 221 may collect the reaction product discharged from the gas discharging pipe 205.

In addition, in a case where the vapor phase growth apparatus 200 includes the recovery unit 214, it is preferable that a distance from the gas discharging pipe 205 to the traps 221 or the recovery portion 215 be short. When the distance is made to be short, a distance at which the vapor of the reaction product diffuses may be made to be short, and thus precipitation of the vapor midway may be further suppressed.

Continuously, a method of using the vapor phase growth apparatus 200 will be described. The description will be mainly given to manufacturing of the nitride semiconductor, and a washing operation of removing the contaminant adhered to various components inside the vapor phase growth apparatus 200.

<Manufacturing of Nitride Semiconductor>

First, manufacturing of the nitride semiconductor using the vapor phase growth apparatus 200 according to the third embodiment will be described, but a method of manufacturing the nitride semiconductor using the vapor phase growth apparatus 200 is not limited thereto.

In a case of manufacturing the nitride semiconductor, generally, a vapor phase growth method, particularly, a Metal Organic Chemical Vapor Deposition (MOCVD) method, or a Hydride Vapor Phase Epitaxy (HVPE) method is used.

Although not particularly limited, in the vapor phase growth apparatus 200 according to the third embodiment, a nitride semiconductor layer is grown on the substrate 201 using the general MOCVD method or HVPE method. Hereinafter, manufacturing of the nitride semiconductor according to the HVPE method will be described.

First, the substrate 201 is placed inside the reaction tank 203, and a temperature inside the reaction tank 203 is raised to a constant temperature. Next, the first raw material gas containing gallium is introduced from the first raw material gas generating chamber 223 to the inside of the reaction tank 203 through the gas introducing pipe 204. Here, the first raw material gas generating chamber 223 will be described. The first raw material gas generating chamber 223 is connected to the container 209 in which the halogen-containing gas is filled, and includes a source boat that accommodates Ga at the inside thereof. When the halogen-containing gas is introduced to the first raw material gas generating chamber 223, Ga in the raw material and the halogen-containing gas react with each other to generate a first raw material gas such as GaCl.

In addition, as the halogen-containing gas filled in the container 210, for example, one kind of compound such as $Cl_2$, HCl, $SiCl_4$, $SiHCl_3$, $SiH_2Cl_2$, $SiH_3Cl$, $BCl_3$, $CHCl_3$, $CH_2Cl_2$, and $CH_3Cl$ which contain chlorine in a molecule, or a mixture of two or more kinds of these compounds is used. Among these, $Cl_2$ is particularly preferable from the viewpoint of the balance in price, reactivity, and the like.

Next, the second raw material gas which is filled in the container 218 and contains ammonia is introduced to the inside of the reaction tank 203 simultaneously with the introduction of the first raw material gas containing gallium. In this case, GaCl that is the first raw material gas and ammonia that is the second raw material gas react with each other, whereby GaN, hydrogen chloride, and hydrogen are generated, and GaN grows on the substrate 201 as a nitride semiconductor layer. The hydrogen chloride and hydrogen are discharged as an exhaust gas, and the hydrogen chloride that is harmful to the human body is removed by a detoxifying device (not shown).

In addition, in the third embodiment, a method of forming the nitride semiconductor layer is not limited to the HVPE method described above, and other methods may be used.

(Washing Operation)

Hereinafter, a washing operation of removing the contaminant adhered to various components inside the vapor phase growth apparatus 200 will be described, but the washing operation of removing the contaminant by the vapor phase growth apparatus 200 is not limited thereto.

First, the substrate 201 on which the nitride semiconductor layer is formed is taken out from the reaction tank 203, and the inside of the reaction tank 203 is heated by the heating device 206 to a desired temperature to be described later as necessary. Here, the inside of the reaction tank 203 may be further set to a decompressed state by the vacuum pump 213.

At this time, a pressure inside the reaction tank 203 is preferably equal to or less than 1 kPa, and more preferably equal to or less than 0.1 kPa. When the pressure is set to be equal to or less than the upper limit, an amount of the halogen-containing gas to be introduced may be increased, and a not-preferable side reaction due to a residual gas may be suppressed, and thus the reaction product may be removed in a more efficient manner.

Here, heating may be carried out after setting the inside of the reaction tank 203 to a decompressed state, or the heating operation and the decompression operation may be carried out simultaneously. The sequence of the heating operation and the decompression operation is not particularly limited as long as the inside finally reaches the above-described temperature and the pressure.

When the inside of the reaction tank 203 reaches desired temperature and pressure, the gas introducing valve 211 is opened to introduce the halogen-containing gas to the inside of the reaction tank 203.

As the halogen-containing gas, for example, one kind of compound such as $Cl_2$, HCl, $SiCl_4$, $SiHCl_3$, $SiH_2Cl_2$, $SiH_3Cl$, $BCl_3$, $CHCl_3$, $CH_2Cl_2$, and $CH_3Cl$ which contain chlorine in a molecule, or a mixture of two or more kinds of these compounds is used. Among these, $Cl_2$ is particularly preferable from the viewpoint of the balance in price, reactivity, and the like.

In addition, an inert gas may be introduced from the container 210 to the inside of the reaction tank 203 together with the introduction of the halogen-containing gas as necessary. Due to the introduction of the inert gas, a concentration of the halogen-containing gas may be regulated.

As the inert gas, for example, any one kind of a gas such as nitrogen, helium, and argon which do not react with the halogen-containing gas, or a mixed gas of two or more kinds of the gases may be used.

In addition, a concentration of the halogen-containing gas inside the reaction tank 203 when introducing the inert gas is not particularly limited. However, when the concentration is too high, various components themselves inside the vapor phase growth apparatus 200 are corroded in some cases, and thus the concentration is appropriately set depending on a degree of contamination and the like.

The concentration of the halogen-containing gas inside the reaction tank 203 when introducing the inert gas is not particularly limited, but it is preferable that the concentration be equal to or more than 5% by volume, and more preferably equal to or more than 10% by volume. When the concentration is set to be equal to or more than the lower limit, a reaction rate between the contaminant and the halogen-containing gas increases, and thus the contaminant adhered to various components inside the vapor phase growth apparatus 200 may be removed in a more efficient manner.

The concentration of the halogen-containing gas is not particularly limited, but it is preferable that the concentration be equal to or less than 100% by volume, and more preferably equal to or less than 80% by volume. When the concentration is set to be equal to or less than the upper limit, the amount of the halogen-containing gas may be small, and thus corrosion of components constituting an apparatus may be suppressed.

The contaminant such as gallium nitride which adhered to the various components reacts with the halogen-containing gas, and thus a reaction product such as gallium halide is generated. The reaction product immediately evaporates to a vapor, and this vapor floats inside the reaction tank 203 and the trapping unit 217.

At this time, it is preferable that the halogen-containing gas be retained inside the apparatus by closing the gas introducing valve 211 and the gas discharging valve 212 so as to allow a reaction between the halogen-containing gas and the contaminant to occur. When the halogen-containing gas is retained inside the apparatus, a reaction rate between the halogen-containing gas and the contaminant may be improved, and thus a used amount of the halogen-containing gas may be further reduced. However, the gas introducing valve 211 and the gas discharging valve 212 may not be completely closed.

In the case of retaining the halogen-containing gas inside the apparatus, after the inside of the reaction tank 203 reaches a desired pressure, the gas introducing valve 211 is closed to retain the halogen-containing gas inside the reaction tank 203 and the trapping unit 217 for a constant time.

At this time, the internal pressure of the reaction tank 203 is preferably equal to or more than 10 kPa, and more preferably equal to or more than 12 kPa. When the internal pressure is set to be equal to or more than the lower limit, a reaction rate between the contaminant and the halogen-containing gas increases, and thus the contaminant adhered to the various components inside the vapor phase growth apparatus 200 may be removed in a more efficient manner.

In addition, the internal pressure is preferably equal to or less than 90 kPa, and more preferably equal to or less than 85 kPa. When the internal pressure is set to be equal to or less than the upper limit, the average free process of the reaction product may be lengthened, and thus diffusion efficiency of the reaction product increases. As a result, reaction efficiency between the contaminant and the halogen-containing gas may further increase.

Although not particularly limited, the internal temperature of the reaction tank 203 at this time is preferably equal to or higher than 500° C., and more preferably equal to or higher than 750° C. When the internal temperature is set to be equal to or higher than the lower limit, a volatilization rate of the reaction product increases, and thus the contaminant adhered to the various components inside the vapor phase growth apparatus 200 may be removed in a more efficient manner.

In addition, although not particularly limited, it is preferable that the internal temperature be equal to or lower than 1000° C., and more preferably equal to or lower than 800° C. When the internal temperature is set to be equal to or lower than the upper limit, thermal deformation of the various components inside the vapor phase growth apparatus 200 may be further prevented.

Although not particularly limited, a retention time of the halogen-containing gas is appropriately set depending on the size of the reaction tank 203, the throughput of the various components inside the vapor phase growth apparatus 200, and the like.

Continuously, the reaction product generated by the reaction between the halogen-containing gas and the contaminant is trapped by the trapping unit 217. For example, water supplied from the temperature control fluid circulator 220 is allowed to flow the cooling portion 219, thereby cooling the trapping unit 217. In this case, the vapor of the reaction product is cooled at the inside of the trapping unit 217, and precipitates to the surface of the trapping unit 217, and is trapped thereon.

After the halogen-containing gas is retained inside the reaction tank 203 for a constant time, the gas discharging valve 212 is opened to discharge an exhaust gas such as an unreacted halogen-containing gas and not-trapped gas from the gas discharging pipe 205.

At this time, more preferably, after the inside of the reaction tank 203 is returned to the atmospheric pressure by opening the gas introducing pipe 204 to introduce the inert gas from the container 210 to the reaction tank 203, the exhaust gas is discharged. When the inert gas is introduced, the exhaust gas is pushed out by the inert gas, and thus exhaust gas may be discharged in a more efficient manner. At this time, although not particularly limited, as the inert gas that is used, the above-described inert gas may be used, or other gases may be used.

In addition, in the operation of washing the various components inside the vapor phase growth apparatus 200 using the vapor phase growth apparatus 200 according to the third embodiment, from the introduction of the halogen-containing gas to the discharging of the exhaust gas are preferably carried out two or more times. When the processes are carried out two or more times, the surface of the various components is further activated, and thus reaction efficiency between the contaminant and the halogen-containing gas may be further raised. Although not particularly limited, the number of repetitions is appropriately set depending on the size of the reaction tank 203, the throughput of the various components, or the like.

In addition, in the operation of washing the various components inside the vapor phase growth apparatus 200 using the vapor phase growth apparatus 200 according to the third embodiment, it is preferable to further carry out discharging of the reaction product that is trapped. A method of discharging the reaction product is not particularly limited, but for example, high-temperature oil is allowed to flow from the temperature control fluid circulator 220 to the cooling portion 219 so as to make the trapping unit 217 warm. In this case, the reaction product precipitated on the surface of the trapping unit 217 is converted into a vapor again, and is discharged from the gas discharging pipe 205.

At this time, more preferably, after the inside of the reaction tank 203 is returned to the atmospheric pressure by opening the gas introducing pipe 204 to introduce the inert gas from the container 210 to the reaction tank 203, a vapor of the reaction product is discharged. When the inert gas is introduced, the vapor of the reaction product is pushed out by the inert gas, and thus vapor may be discharged in a more efficient manner. At this time, although not particularly limited, as the inert gas that is used, the above-described inert gas may be used, or other gases may be used.

In addition, in the operation of washing the various components inside the vapor phase growth apparatus 200 using the vapor phase growth apparatus 200 according to the third embodiment, it is preferable that after collecting a constant amount of the reaction product trapped by the trapping unit 217, the trapped reaction product be discharged. Although not particularly limited, the number of repetitions is appropriately set depending on a trapped amount of the reaction product.

In addition, in the operation of washing the various components inside the vapor phase growth apparatus 200 using the vapor phase growth apparatus 200 according to the third embodiment, it is preferable to further carry out recovering of the gallium compound from the reaction product. The recovering method is not particularly limited, but may be carried out using, for example, an apparatus shown in FIG. 9. First, a vapor of the reaction product discharged from the gas discharging pipe 205 is trapped by the recovery portion 215. Then, the ammonia gas is introduced from the container 216 to the recovery portion 215 to allow a gallium halide contained in the reaction product and the ammonia to react with each other, thereby generating a solid of the gallium compound and the like. Since the gallium compound is recovered from the reaction product, an amount of the exhaust gas that is harmful may be reduced.

In addition, as shown in FIG. 10, in the vapor phase growth apparatus 200, the reaction product may be transmitted to the recovery portion 215 after trapping and collecting a constant amount of discharged reaction product by a plurality of traps 221 provided between the gas discharging pipe 205 and the recovery portion 215. According to this configuration, a process of recovering the gallium compound may be carried out in stages.

Hereinbefore, the third embodiment of the invention has been described with reference to the drawings, but the drawings are illustrative only, and various configurations other than that of the drawings may be employed.

In the third embodiment, growth according to the HVPE method has been exemplified, but the invention is applicable to the MOCVD method, an Atomic Layer Deposition (ALD) method, and the like.

EXAMPLES

Hereinafter, the invention will be described with reference to examples and comparative examples, but the invention is not limited thereto.

Example 1

Hereinafter, in Examples 1 to 7, and Comparative Examples 1 and 2, the washing apparatus shown in FIG. 1 was used.

A semiconductor manufacturing apparatus component to which GaN adhered was disposed in the component holding portion inside the reaction tank, and a temperature inside the reaction tank was set to 750° C., and a pressure inside the reaction tank was set to be equal to or less than 0.1 kPa. Next, a $N_2$ gas was introduced to the inside of the reaction tank, the pressure was set to 20 kPa, and then a $Cl_2$ gas was introduced to the inside of the reaction tank to set the pressure to 40 kPa (a pressure of the $Cl_2$ gas was 20 kPa). Retention was carried out as is for 10 minutes, and then an exhaust valve was opened to discharge a vapor of a reaction product.

Continuously, the inside of the reaction tank was returned to the atmospheric pressure by introduction of the $N_2$ gas, and then the weight of the component to which GaN adhered was measured. Here, from an amount of the $Cl_2$ gas that was used, and an amount of GaN that was removed, reaction efficiency was calculated using the following Expression (1).

Reaction efficiency[%]=100×(the number of moles of GaN that was removed×1.5)/(the number of moles of $Cl_2$ that was used)　　(1)

In addition, the amount of $Cl_2$ gas necessary to remove 1 mole of GaN was theoretically 1.5 moles.

GaN that was removed was 3.5 g (0.042 moles), and the amount of $Cl_2$ gas that was used was totally 3.2 L (0.13 moles). Accordingly, the reaction efficiency was 48.2%.

Example 2

The washing process was carried out in the same manner as Example 1 except that serial operations of the introduction of the $N_2$ gas, the introduction of the $Cl_2$ gas, the retention for 10 minutes, and the discharging of the reaction product were carried out four times. Obtained results are shown in Table 1.

Example 3

A semiconductor manufacturing apparatus component to which GaN adhered was disposed in the component holding portion inside the reaction tank, and the temperature inside the reaction tank were set to 730° C., and the pressure inside the reaction tank was set to be equal to or less than 0.1 kPa. Next, the $N_2$ gas was introduced to the inside of the reaction tank, the pressure was set to 10 kPa, and then the $Cl_2$ gas was introduced to the inside of the reaction tank to set the pressure to 30 kPa. Retention was carried out as is for 10 minutes, and then the exhaust valve was opened to discharge a vapor of a reaction product. Continuously, serial operations of the introduction of $N_2$ gas, the introduction of $Cl_2$ gas, the retention for 10 minutes, and the discharging of the reaction product were carried out two times.

Continuously, the inside of the reaction tank was returned to the atmospheric pressure by introduction of the $N_2$ gas, a reaction tank was set to be equal to or less than 90 kPa, the reaction efficiency could be improved compared to Comparative Examples 1 and 2.

In addition, when the number of washing times was increased, the reaction efficiency could be further improved.

TABLE 1

|  | Example 1 | Example 2 | Example 3 | Example 4 | Example 5 | Example 6 | Example 7 | Comparative Example 1 | Comparative Example 2 |
|---|---|---|---|---|---|---|---|---|---|
| Washing type | Sealing type | Sealing type | Sealing type | Sealing type | Sealing type | Sealing type | Sealing type | Sealing type | Air stream type |
| Temperature inside reaction tank (° C.) | 750 | 750 | 730 | 730 | 730 | 730 | 730 | 730 | 800 |
| $N_2$ gas pressure inside reaction tank (kPa) | 20 | 20 | 10 | 20 | 40 | 60 | 70 | 80 | — |
| $Cl_2$ gas pressure inside reaction tank (kPa) | 20 | 20 | 20 | 20 | 20 | 20 | 20 | 20 | — |
| Pressure inside reaction tank (kPa) | 40 | 40 | 30 | 40 | 60 | 80 | 90 | 100 | — |
| Number of times of washing (times) | 1 | 4 | 2 | 2 | 2 | 2 | 2 | 2 | 1 |
| Washing time for one time (minute) | 10 | 10 | 10 | 10 | 10 | 10 | 10 | 10 | 30 |
| Total amount of $Cl_2$ gas used (L) | 3.2 | 12.8 | 6.4 | 6.4 | 6.4 | 6.4 | 6.4 | 6.4 | 9.0 |
| Amount of removed GaN (g) | 3.5 | 28.1 | 11.9 | 11.4 | 10.5 | 9.5 | 8.4 | 4.2 | 1.0 |
| Reaction efficiency (%) | 48.2 | 96.9 | 82.0 | 78.6 | 72.4 | 65.5 | 57.9 | 28.9 | 5.0 | and then the weight of the component to which GaN adhered was measured. Here, from an amount of the $Cl_2$ gas that was used, and an amount of GaN that was removed, reaction efficiency was calculated using Expression (1). Obtained results are shown in Table 1.

Examples 4 to 7, and Comparative Example 1

The washing process was carried out in the same manner as Example 3 except that the pressure inside the reaction tank was set to values shown in Table 1, respectively. Obtained results are shown in Table 1.

Comparative Example 2

A component to which GaN adhered was disposed in the component holding portion inside the reaction tank, and the temperature inside the reaction tank was set to 800° C. Next, in a state of opening the exhaust valve, a mixed gas of the $Cl_2$ gas and the $N_2$ gas was supplied to the inside of the reaction tank for 30 minutes. Here, a flow rate of the $Cl_2$ gas was set to 0.3 L/min, and a flow rate of the $N_2$ gas was set to 0.3 L/min.

The atmosphere inside of the reaction tank was substituted with $N_2$, and the weight of the component to which GaN adhered was measured. GaN that was removed was 1.0 g (0.011 moles), an amount of the $Cl_2$ gas that was used was totally 9.0 L (0.37 moles). Accordingly, the reaction efficiency was 5%.

(Evaluation Result)

Evaluation results are shown in Table 1. When the washing type was set to a sealing type, and the pressure inside the Example 8

In the following Example 8, the washing apparatus shown in FIGS. 4 and 5 was used.

A semiconductor manufacturing apparatus component to which GaN adhered was disposed in the component holding portion inside a washing processing portion, and a temperature inside the washing processing portion was set to 750° C. In addition, water in a water temperature of 25° C. was circulated to the cooling portion by the temperature control fluid circulator at a flow rate of 2 L/min. Then, the pressure inside the washing processing portion was set to be equal to or less than 0.1 kPa by operating the vacuum pump.

Next, the pressure was set to 20 kPa by introducing the $N_2$ gas to the inside of the washing processing portion, and then the pressure was set to 40 kPa by introducing the $Cl_2$ gas to the inside of the reaction tank. Retention was carried out as is for 10 minutes, the exhaust valve was opened to discharge the exhaust gas. Serial operations of the introduction of the $N_2$ gas, the introduction of the $Cl_2$ gas, the retention for 10 minutes, and the discharging of the exhaust gas were carried out four times.

Next, oil of 100° C. was circulated to the cooling portion by the temperature control fluid circulator at a flow rate of 3 L/min so as to make the cooling panel inside the cooling portion warm. Continuously, the inside of the apparatus was returned to the atmospheric pressure by introduction of the $N_2$ gas, and then a vapor of $GaCl_3$ that was the reaction product was introduced to the recovery portion by opening the gas exhaust valve. Simultaneously with these operations, the $NH_3$ gas was introduced to the recovery portion to allow $GaCl_3$ and $NH_3$ to react with each other. When a gallium chloride adhered to the cooling panel inside the cooling portion disappeared, the NH$_3$ gas introduction valve was closed.

Furthermore, after the N$_2$ gas was introduced to the inside of the apparatus for 10 minutes, the component to which GaN adhered was taken out, and the weight thereof was measured. Here, from an amount of the Cl$_2$ gas that was used, and an amount of GaN that was removed, reaction efficiency was calculated using the following Expression (1).

Reaction efficiency[%]=100×(the number of moles of GaN that was removed×1.5)/(the number of moles of Cl$_2$ that was used)    (1)

In addition, the amount of Cl$_2$ gas necessary to remove 1 mole of GaN was theoretically 1.5 moles.

GaN that was removed was 28.1 g (0.336 moles), and the amount of Cl$_2$ gas that was used was totally 12.8 L (0.520 moles). Accordingly, the reaction efficiency was 96.9%.

In addition, gallium compounds such as an oligomer (NH$_2$GaCl$_2$)$_n$ containing NH$_4$Cl and Ga, and GaN were trapped from the recovery portion.

Priority is claimed on Japanese Patent Application No. 2011-112426, filed on May 19, 2011, and Japanese Patent Application No. 2011-162261, filed on Jul. 25, 2011, the contents of which are incorporated herein by reference.

The invention claimed is:

1. A method for washing a semiconductor manufacturing apparatus component, the method comprising:
   a first process of disposing a semiconductor manufacturing apparatus component, to which a nitride semiconductor adheres, in a component holding portion inside a reaction tank of a washing apparatus;
   a second process of introducing a halogen-containing gas from a gas introducing pipe into the reaction tank to remove the nitride semiconductor adhered to the semiconductor manufacturing apparatus component;
   a third process of trapping a reaction product generated by a reaction of the halogen-containing gas and the nitride semiconductor in a trapping unit;
   a fourth process of discharging the reaction product trapped by the trapping unit from a gas discharging pipe to outside of the reaction tank,
   wherein the washing apparatus comprises:
   the reaction tank that accommodates the component holding portion and the trapping unit;
   the component holding portion that holds the semiconductor manufacturing apparatus component;
   the gas introducing pipe that introduces the halogen-containing gas to react with the nitride semiconductor;
   the trapping unit that traps the reaction product of the nitride semiconductor and the halogen-containing gas;
   the gas discharging pipe that discharges the reaction product to an outside of the reaction tank;
   a washing processing portion; and
   a cooling portion that cools the trapping unit,
   wherein the washing processing portion and the trapping unit are enclosed by the reaction tank,
   wherein the component holding portion is disposed inside the washing processing portion, and the trapping unit is disposed inside the cooling portion,
   wherein the gas discharging pipe is directly connected to the cooling portion,
   wherein the cooling portion has a function of regulating a temperature inside the trapping unit, and
   wherein in the third process, the reaction product is trapped by lowering the temperature inside the trapping unit, and in the fourth process, by converting the temperature inside the trapping unit to a higher temperature, the trapped reaction product is converted into vapor again, and then the reaction product trapped by the trapping unit is discharged to the outside of the reaction tank.

2. The method for washing a semiconductor manufacturing apparatus component according to claim 1,
   wherein the washing apparatus further comprises a temperature control fluid circulator connected to the cooling portion, and
   wherein in the third process and the fourth process, the temperature inside the trapping unit is adjusted by using the temperature control fluid circulator.

3. The method for washing a semiconductor manufacturing apparatus component according to claim 1,
   wherein the halogen-containing gas includes Cl$_2$ gas.

4. The method for washing a semiconductor manufacturing apparatus component according to claim 1,
   wherein the nitride semiconductor is expressed by a general formula of Al$_x$In$_y$Ga$_{1-x-y}$N (provided that, x and y satisfy relationships of 0≤x<1, 0≤y<1, and 0≤x+y<1).

5. The method for washing a semiconductor manufacturing apparatus component according to claim 1,
   wherein the washing apparatus further comprises a container containing the halogen-containing gas and connected to the gas introducing pipe.

6. The method for washing a semiconductor manufacturing apparatus component according to claim 1,
   wherein in the second process, the inside of the reaction tank is set to a decompressed state, and then the halogen-containing gas is introduced into the reaction tank from the gas introducing pipe.

7. The method for washing a semiconductor manufacturing apparatus component according to claim 1,
   wherein in the second process, the halogen-containing gas is retained inside the washing processing portion to remove the nitride semiconductor adhered to the semiconductor manufacturing apparatus component, and
   wherein a pressure inside the washing processing portion in the second process is equal to or more than 10 kPa and equal to or less than 90 kPa.

8. The method for washing a semiconductor manufacturing apparatus component according to claim 1,
   wherein in the fourth process, an inert gas is introduced to the inside of the reaction tank, and a vapor of the reaction product is discharged to the outside of the reaction tank.

9. The method for washing a semiconductor manufacturing apparatus component according to claim 1, further comprising:
   a fifth process of recovering a gallium compound from the reaction product.

10. The method for washing a semiconductor manufacturing apparatus component according to claim 9,
    wherein in the fifth process, NH$_3$ and the reaction product are allowed to react with each other to recover the gallium compound.

11. The method for washing a semiconductor manufacturing apparatus component according to claim 1,
    wherein in the second process, an inert gas is introduced to the inside of the reaction tank.

12. The method for washing a semiconductor manufacturing apparatus component according to claim 1,
    wherein a temperature inside the washing processing portion in the second process is equal to or higher than 500° C. and equal to or lower than 1000° C.

13. The method for washing a semiconductor manufacturing apparatus component according to claim 1,
wherein the trapping unit is a cooling panel.

14. The method for washing a semiconductor manufacturing apparatus component according to claim 1,
wherein the trapping unit is formed from a material that does not react with the reaction product.

15. The method for washing a semiconductor manufacturing apparatus component according to claim 14,
wherein the trapping unit is formed from quartz.

16. The method for washing a semiconductor manufacturing apparatus component according to claim 1,
wherein the washing apparatus further comprises a recovery unit that recovers a gallium compound from the reaction product.

17. The method for washing a semiconductor manufacturing apparatus component according to claim 16,
wherein in the recovery unit, $NH_3$ and the reaction product are allowed to react with each other to recover the gallium compound.

18. The method for washing a semiconductor manufacturing apparatus component according to claim 1,
wherein in the second process, the gas introducing pipe and the gas discharging pipe are closed to retain the halogen-containing gas inside the reaction tank.

19. The method for washing a semiconductor manufacturing apparatus component according to claim 1,
wherein a hooking portion that hooks and holds the semiconductor manufacturing apparatus component is formed in the component holding portion in order for the entire surface of the semiconductor manufacturing apparatus component to be processed.

* * * * *